US012564079B2

(12) United States Patent
Lee et al.

(10) Patent No.: US 12,564,079 B2
(45) Date of Patent: Feb. 24, 2026

(54) SEMICONDUCTOR PACKAGE INCLUDING A REDISTRIBUTION SUBSTRATE AND A PAIR OF SIGNAL PATTERNS

(71) Applicant: Samsung Electronics Co., Ltd., Suwon-si (KR)

(72) Inventors: Yun-Hee Lee, Hwaseong-si (KR); Jaesun Kim, Hwaseong-si (KR); Seokbeom Yong, Yongin-si (KR); Wonjae Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 694 days.

(21) Appl. No.: 17/886,872

(22) Filed: Aug. 12, 2022

(65) Prior Publication Data

US 2023/0170290 A1 Jun. 1, 2023

(30) Foreign Application Priority Data

Nov. 26, 2021 (KR) ........................ 10-2021-0165375

(51) Int. Cl.
| | |
|---|---|
| *H01L 23/498* | (2006.01) |
| *H01L 23/00* | (2006.01) |
| *H01L 23/31* | (2006.01) |

(52) U.S. Cl.
CPC .... *H01L 23/49838* (2013.01); *H01L 23/3128* (2013.01); *H01L 23/49816* (2013.01); *H01L 23/49822* (2013.01); *H01L 24/16* (2013.01); *H01L 24/13* (2013.01); *H01L 24/29* (2013.01); *H01L 24/73* (2013.01); *H01L 24/81* (2013.01); *H01L 2224/13147* (2013.01); *H01L*

*2224/16238* (2013.01); *H01L 2224/2919* (2013.01); *H01L 2224/73204* (2013.01); *H01L 2224/81444* (2013.01); *H01L 2224/81447* (2013.01); *H01L 2224/81455* (2013.01); *H01L 2924/0665* (2013.01)

(58) Field of Classification Search
CPC ........... H01L 23/49838; H01L 23/3128; H01L 23/49822; H01L 23/49827; H01L 2223/6638; H01L 21/4857; H01L 23/5383; H01L 2223/6616

See application file for complete search history.

(56) References Cited

U.S. PATENT DOCUMENTS

| | | | |
|---|---|---|---|
| 9,622,350 B2 | 4/2017 | Roy et al. | |
| 10,211,190 B2 * | 2/2019 | Kim .................... | H01L 23/5389 |

(Continued)

FOREIGN PATENT DOCUMENTS

| | | |
|---|---|---|
| KR | 20210106588 A | 8/2021 |

*Primary Examiner* — Khiem D Nguyen
(74) *Attorney, Agent, or Firm* — Muir Patent Law, PLLC

(57) ABSTRACT

Disclosed is a semiconductor package comprising a redistribution substrate and a semiconductor chip on the redistribution substrate. The redistribution substrate includes a plurality of first conductive patterns including a pair of first signal patterns that are adjacent to each other, and a plurality of second conductive patterns on surfaces of the first conductive patterns and coupled to the first conductive patterns. The second conductive patterns include a ground pattern insulated from the pair of first signal patterns. The ground pattern has an opening that penetrates the ground pattern. When viewed in plan, the pair of first signal patterns overlap the opening.

20 Claims, 20 Drawing Sheets

10

(56)  References Cited

U.S. PATENT DOCUMENTS

| | | | |
|---|---|---|---|
| 10,304,700 B2 | 5/2019 | Liu et al. | |
| 10,672,712 B2 | 6/2020 | Bhagavat et al. | |
| 11,069,630 B2 | 7/2021 | Chen et al. | |
| 2011/0108981 A1 | 5/2011 | Rahim et al. | |
| 2019/0109095 A1* | 4/2019 | Min | H01L 23/552 |
| 2019/0122994 A1* | 4/2019 | Lee | H01L 21/565 |
| 2019/0221240 A1* | 7/2019 | Jeon | G06F 13/1689 |
| 2020/0335441 A1 | 10/2020 | Kim et al. | |
| 2020/0373243 A1* | 11/2020 | Jang | H01L 23/3121 |
| 2021/0111110 A1 | 4/2021 | Chou | |
| 2021/0193636 A1* | 6/2021 | Suk | H01L 24/19 |

* cited by examiner

SEMICONDUCTOR PACKAGE INCLUDING A REDISTRIBUTION SUBSTRATE AND A PAIR OF SIGNAL PATTERNS

CROSS-REFERENCE TO RELATED APPLICATION

This U.S. nonprovisional application claims priority under 35 U.S.C § 119 to Korean Patent Application No. 10-2021-0165375, filed on Nov. 26, 2021, in the Korean Intellectual Property Office, the disclosure of which is hereby incorporated by reference in its entirety.

BACKGROUND

The present inventive concepts relate to a semiconductor package, and more particularly, to a semiconductor package including a redistribution substrate.

A semiconductor package is provided to implement an integrated circuit chip for use in electronic products. A semiconductor package is typically configured such that a semiconductor chip is mounted on a printed circuit board and bonding wires or bumps are used to electrically connect the semiconductor chip to the printed circuit board. With the development of electronic industry, various researches have been conducted to improve reliability and durability of semiconductor packages.

SUMMARY

Some embodiments of the present inventive concepts provide a semiconductor package whose electrical properties are improved.

According to some embodiments of the present inventive concepts, a semiconductor package may comprise: a redistribution substrate; and a semiconductor chip on the redistribution substrate. The redistribution substrate may include: a plurality of first conductive patterns including a pair of first signal patterns that are adjacent to each other; and a plurality of second conductive patterns on first surfaces of the first conductive patterns and coupled to the first conductive patterns. The second conductive patterns may include a ground pattern insulated from the pair of first signal patterns. The ground pattern may have an opening that penetrates the ground pattern. When viewed in plan, the pair of first signal patterns may overlap the opening.

According to some embodiments of the present inventive concepts, a semiconductor package may comprise: a redistribution substrate that includes a plurality of first conductive patterns, a plurality of second conductive patterns, and a plurality of third conductive patterns; a plurality of solder balls on a bottom surface of the redistribution substrate; and a semiconductor chip on a top surface of the redistribution substrate. The second conductive patterns may be between the first conductive patterns and the third conductive patterns. The first conductive patterns may include a first signal pattern. The second conductive patterns may include a second redistribution pattern insulated from the first signal pattern. The third conductive patterns may include a third redistribution pattern that is insulated from and vertically overlaps the first signal pattern. The second redistribution pattern may not be between the first signal pattern and the third conductive pattern.

According to some embodiments of the present inventive concepts, a semiconductor package may comprise: a redistribution substrate; a plurality of solder balls on a bottom surface of the redistribution substrate; a semiconductor chip on a top surface of the redistribution substrate; and a molding layer on the top surface of the redistribution substrate, the molding layer covering the semiconductor chip. The redistribution substrate may include: a dielectric layer that includes a photo-imageable polymer; a plurality of first conductive patterns in the dielectric layer and laterally spaced apart from each other; a plurality of second conductive patterns on surfaces of the first conductive patterns and coupled to the first conductive patterns; and a plurality of third conductive patterns on surfaces of the second conductive patterns and coupled to the second conductive patterns. The first conductive patterns may include: a pair of first signal patterns that are adjacent to each other; and a plurality of first redistribution patterns laterally spaced apart from the pair of first signal pattern. The first redistribution patterns may be electrically insulated from the pair of first signal patterns. The second conductive patterns may include: a plurality of second signal patterns coupled to the pair of first signal patterns; and a plurality of second redistribution patterns insulated from the second signal patterns. The third conductive patterns may include: a plurality of third signal patterns coupled to the second signal patterns; and a plurality of third redistribution patterns insulated from the third signal patterns. The pair of first signal patterns may not vertically overlap the second redistribution patterns. The pair of first signal patterns may vertically overlap at least one of the third redistribution patterns. The first redistribution patterns may include a first signal redistribution pattern, a first ground pattern, and a first power pattern. The second redistribution patterns may include a second signal redistribution pattern, a second ground pattern, and a second power pattern. The third redistribution patterns may include a third signal redistribution pattern, a third ground pattern, and a third power pattern. Each of the second conductive patterns may include a via portion and a wire portion on the via portion.

BRIEF DESCRIPTION OF THE DRAWINGS

Figure 1A:
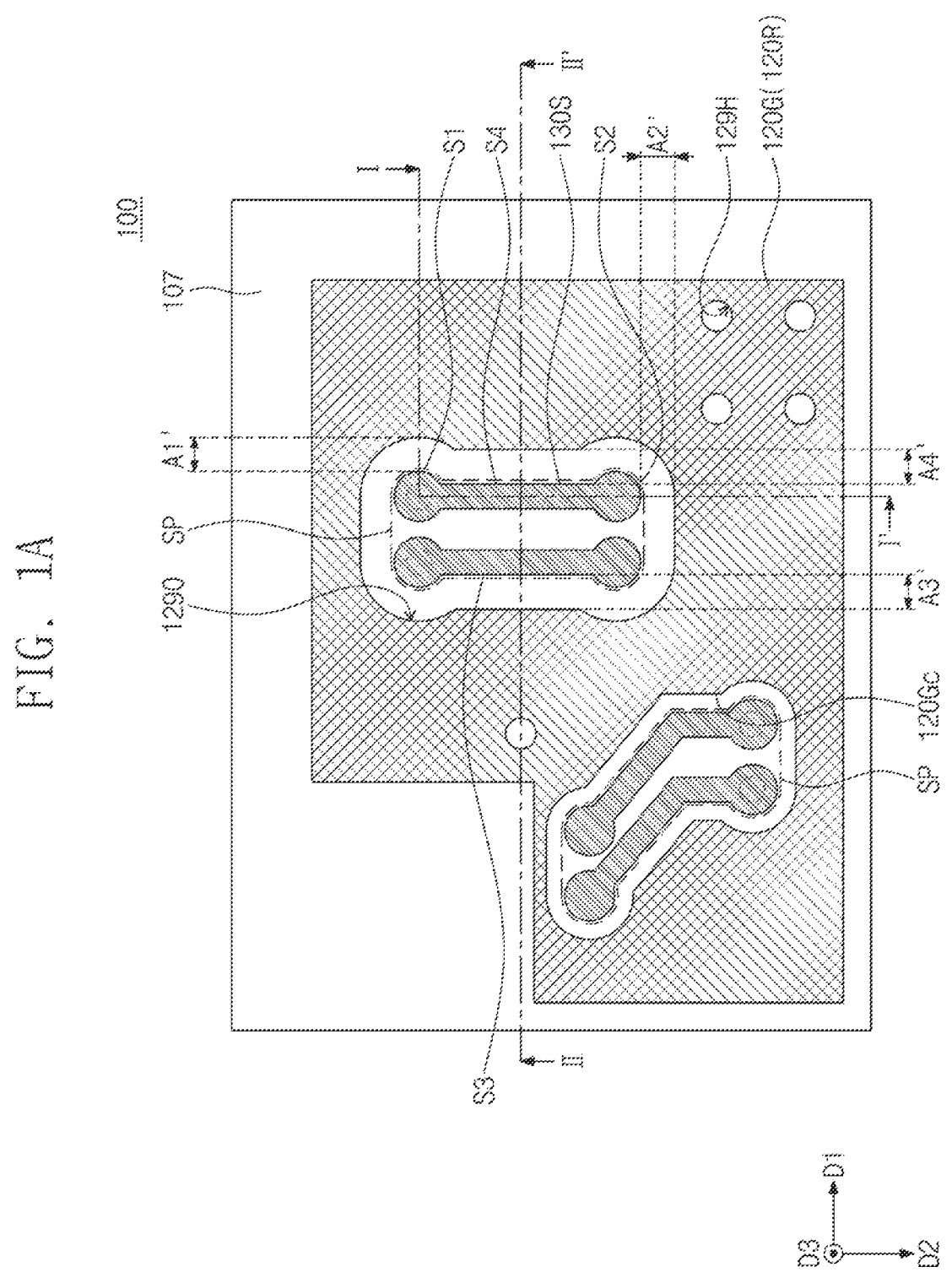
Figure 1B:
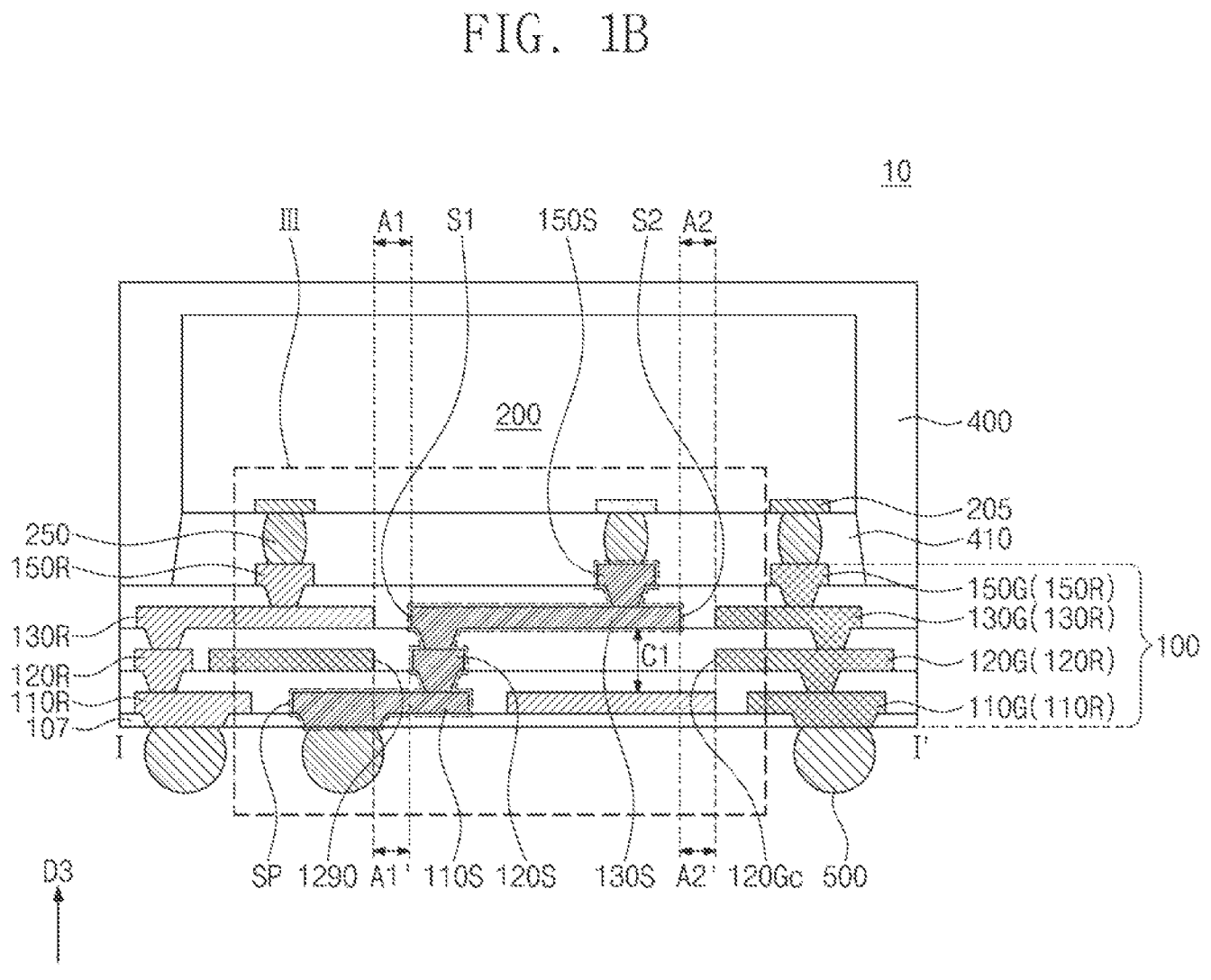

FIG. 1A illustrates a plan view showing a second ground pattern and third signal patterns of a redistribution substrate, according to example embodiments.

FIG. 1B illustrates a cross-sectional view taken along line I-I' of FIG. 1A.

FIG. 1D illustrates a cross-sectional view taken along line II-II' of FIG. 1A.

FIG. 2C illustrates a cross-sectional view taken along line I-I' of FIG. 2A.

FIG. 2D illustrates a cross-sectional view taken along line II-II' of FIG. 2A.

FIG. 3B illustrates a cross-sectional view taken along line I-I' of FIG. 3A.

FIG. 3C illustrates a cross-sectional view taken along line II-II' of FIG. 3A.

FIG. 7 illustrates a cross-sectional view showing a semiconductor package, according to example embodiments.

FIG. 8 illustrates a cross-sectional view showing a semiconductor package, according to example embodiments.

DETAIL DESCRIPTION

Figure 1C:
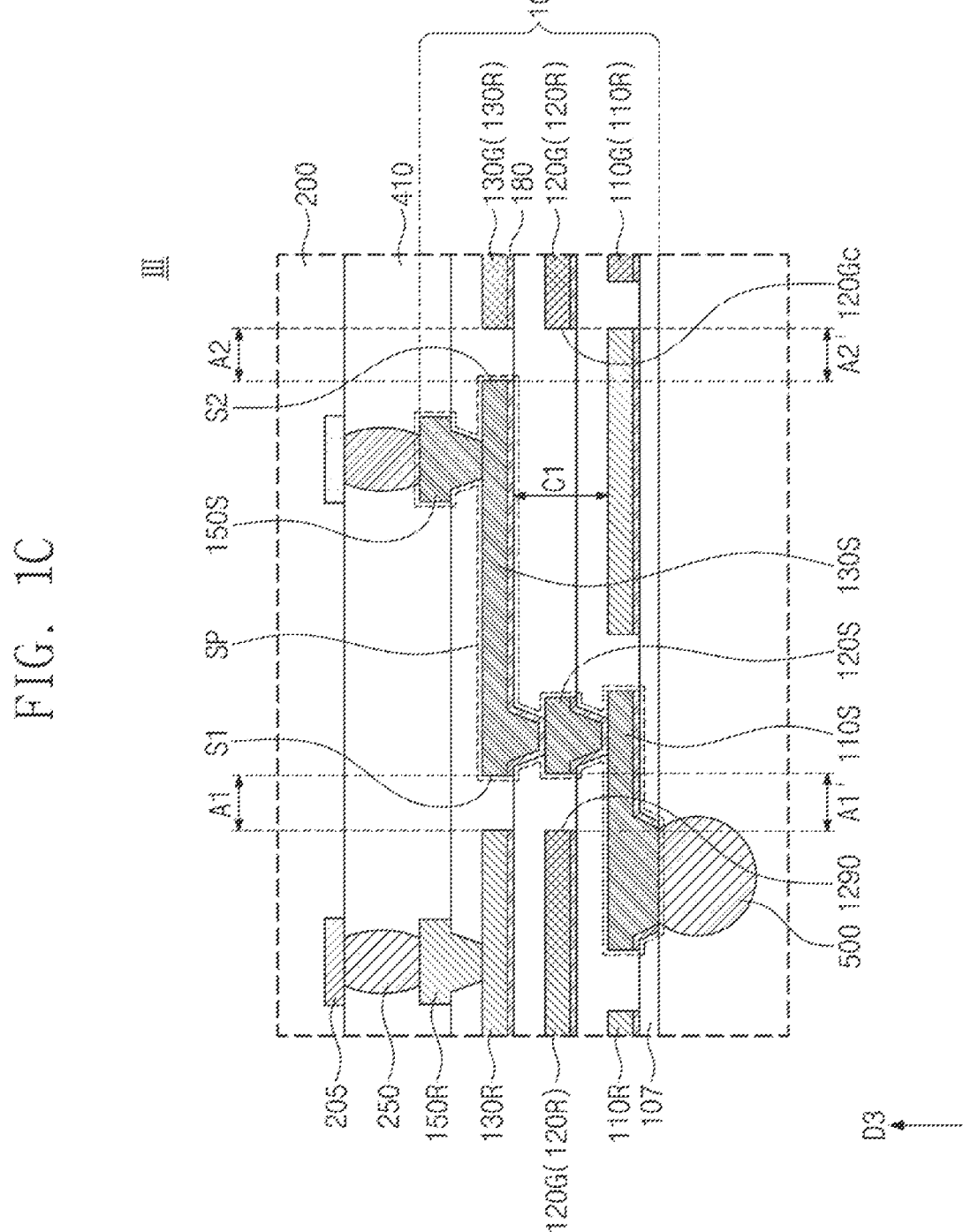
FIG. 1C illustrates an enlarged view showing section III of FIG. 1B.

In this description, like reference numerals may indicate like components. The following will now describe semiconductor packages according to the present inventive concepts.

Figure 1D:
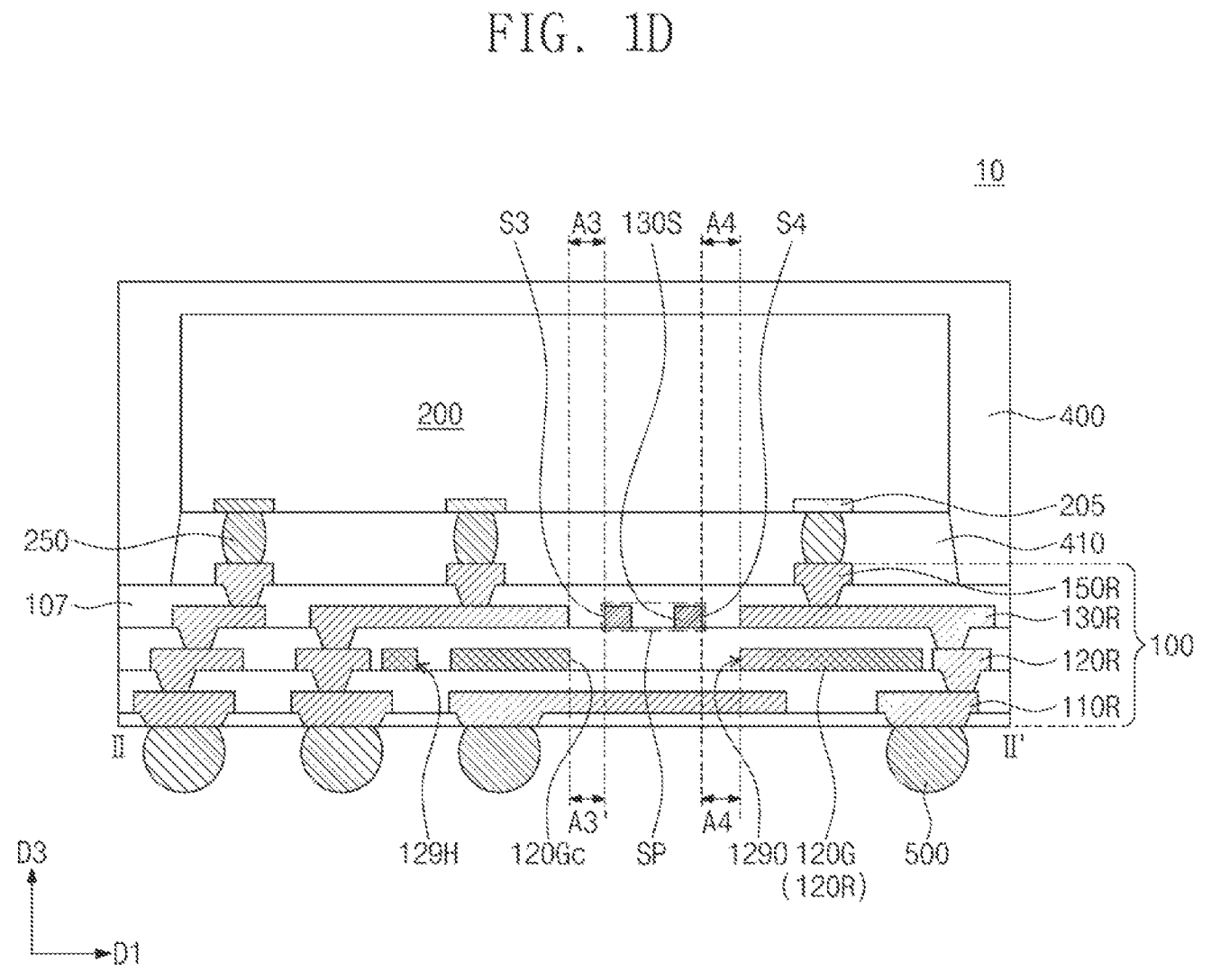
Figure 1E:
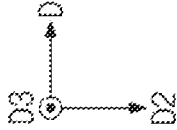
FIG. 1E illustrates a plan view showing first conductive patterns, according to example embodiments.
Figure 1F:
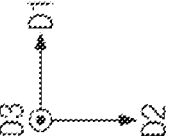
FIG. 1F illustrates a plan view showing second conductive patterns, according to example embodiments.
Figure 1G:
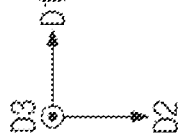
FIG. 1G illustrates a plan view showing third conductive patterns, according to example embodiments.

FIG. 1A illustrates a plan view showing a second ground pattern and third signal patterns of a redistribution substrate according to example embodiments. FIG. 1B illustrates a cross-sectional view taken along line I-I' of FIG. 1A. FIG. 1C illustrates an enlarged view showing section III of FIG. 1B. FIG. 1D illustrates a cross-sectional view taken along line II-II' of FIG. 1A. FIG. 1E illustrates a plan view showing first conductive patterns according to example embodiments. FIG. 1F illustrates a plan view showing second conductive patterns according to example embodiments. FIG. 1G illustrates a plan view showing third conductive patterns according to example embodiments. FIG. 1B corresponds to a cross-section taken along line I-I' of FIG. 1E, IF, or 1G. FIG. 1D corresponds to a cross-section taken along line II-II' of FIG. 1E, IF, or 1G.

Referring to FIGS. 1A to 1G, a semiconductor package 10 may include a redistribution substrate 100, solder balls 500, a semiconductor chip 200, and a molding layer 400. The redistribution substrate 100 may have a top surface and a bottom surface that are opposite to each other.

As illustrated in FIG. 1B, the solder balls 500 may be disposed on the bottom surface of the redistribution substrate 100. The solder balls 500 may serve as terminals of the semiconductor package 10. The solder balls 500 may include ground solder balls and signal solder balls. The ground solder balls and signal solder balls may be laterally spaced apart and electrically separated from each other. The ground solder balls may each be a terminal to which a ground voltage is applied. The signal solder balls may each serve as a path through which a data signal is input and output. The solder balls 500 may include a solder material. The solder material may include tin, silver, bismuth, lead, or any alloy thereof.

The redistribution substrate 100 may include a dielectric layer 107, first conductive patterns 110R and 110S, second conductive patterns 120R and 120S, third conductive patterns 130R and 130S, and conductive pads 150R and 150S. The dielectric layer 107 may include an organic material, such as a photo-imageable dielectric material. The photo-imageable dielectric material may be a polymer. The photo-imageable dielectric material may include, for example, at least one selected from photosensitive polyimide, polybenzoxazole, phenolic polymers, and benzocyclobutene polymers. In some embodiments, the dielectric layer 107 may be provided in plural. There may be a variation in the number of the plurality of dielectric layers 107 that are stacked. For example, the plurality of dielectric layers 107 may include the same material. An indistinct interface may be provided between neighboring dielectric layers 107. Alternatively, a lowermost dielectric layer 107 and an uppermost dielectric layer 107 may include a different material from those of other dielectric layers 107. For example, the lowermost dielectric layer 107 and the uppermost dielectric layer 107 may include a solder resist material and may serve as a protection layer.

The bottom surface of the redistribution substrate 100 may include a bottom surface of the lowermost dielectric layer 107. A first direction (see first direction D1 of FIG. 1A) may be parallel to a bottom surface of the lowermost dielectric layer 107. A second direction (see second direction D2 of FIG. 1A) may be parallel to the bottom surface of the lowermost dielectric layer 107 and substantially orthogonal to the first direction D1. A third direction D3 may be substantially perpendicular to the first direction D1 and the second direction D2.

The first conductive patterns 110R and 110S may be provided in and on the lowermost dielectric layer 107. Each of the first conductive patterns 110R and 110S may include an under-bump portion and a first wire portion. The under-bump portion may be provided in the lowermost dielectric layer 107. For example, the under-bump portion of the may extend through the lowermost dielectric layer 107, and a bottom surface of the under-bump portion may be coplanar with a bottom surface of the lowermost dielectric layer 107. The under-bump portion may be provided on a bottom surface of the solder ball 500 that corresponds thereto. The first wire portion and the under-bump portion may be connected to each other without an interface therebetween. For example, the first wire portion and the under-bump portion may be in material continuity with one another. As used herein, the term "material continuity" may refer to structures, patterns, and/or layers that are formed at the same time and of the same material, without a break in the continuity of the material of which they are formed. As one example, structures, patterns, and/or layers that are in "material continuity" may be homogeneous monolithic structures. The first wire portion may be provided on a top surface of the lowermost dielectric layer 107. For example, the first wire portion may be in contact with the top surface of the lowermost dielectric layer 107. The first conductive patterns 110R and 110S may include metal, such as copper.

The first conductive patterns 110R and 110S may include a first signal pattern 110S and first redistribution patterns 110R. As shown in FIG. 1E, the first signal pattern 110S may include a pair of first signal patterns. The pair of first signal patterns 110S may be adjacent to each other. The pair of first signal patterns 110S may be a portion of a signal pair pattern SP. The signal pair pattern SP may be a differential signal pair. The first signal patterns 110S may be used for transfer of differential signal pairs and/or transfer of high-speed signals.

As shown in FIG. 1B, the first redistribution patterns 110R may be laterally spaced apart and electrically insulated from the first signal patterns 110S. In this description, the phrase "laterally spaced apart from" may mean "horizontally spaced apart." The term "horizontally" may mean "parallel to the bottom surface of the redistribution substrate 100." For example, the term "horizontally" may mean "parallel to the first direction D1 or the second direction D2." The first redistribution patterns 110R may include a first signal redistribution pattern and a first ground pattern 110G that are spaced apart from each other. The first signal redistribution pattern may transfer an electric signal different from those transmitted by the first signal patterns 110S. The first ground pattern 110G may be configured to receive a ground voltage. The first redistribution patterns 110R may further include a first power pattern. The first power pattern may be laterally spaced apart and electrically insulated from the first signal redistribution pattern and the first ground pattern 110G. The first power pattern may be configured to receive a power voltage. The power voltage may be different from the ground voltage.

The second conductive patterns 120R and 120S may be provided on surfaces of the first conductive patterns 110R and 110S, and may be electrically connected to the first conductive patterns 110R and 110S, respectively. The surfaces of the first conductive patterns 110R and 110S may be top surfaces of the first conducive patterns 110R and 110S. The second conductive patterns 120R and 120S may contact the top surfaces of the first conductive patterns 110R and 110S, respectively. Each of the second conductive patterns 120R and 120S may include a second via portion and a second wire portion. The second via portion may be provided in the dielectric layer 107 that corresponds thereto. The second via portion may contact a top surface of a corresponding one of the first conductive patterns 110R and 110S. The second wire portion may be provided on the second via portion and a top surface of the dielectric layer 107. For example, the second wire portion may be in contact with the top surface of the dielectric layer 107. The second wire portion and the second via portion may be connected to each other without an interface therebetween. For example, the second wire portion and the second via portion may be in material continuity with one another. The second conductive patterns 120R and 120S may include metal, such as copper.

The second conductive patterns 120R and 120S may include second signal patterns 120S and second redistribution patterns 120R. The second signal patterns 120S may be provided on and coupled to the first signal pattern 110S. As illustrated in FIG. 1F, the second signal patterns 120S may include a pair of neighboring second signal patterns 120S. The pair of second signal patterns 120S may be another portion of the signal pair pattern SP. The second signal patterns 120S may be used for transfer of high-speed signals.

The second redistribution patterns 120R may be provided on and coupled to the first redistribution patterns 110R. The second redistribution patterns 120R may be laterally spaced apart and electrically insulated from the second signal patterns 120S. The second redistribution patterns 120R may include a second ground pattern 120G, a second signal redistribution pattern, and a second power pattern. The second signal redistribution pattern may transfer an electric signal different from those transmitted by the second signal patterns 120S. The second ground pattern 120G may be laterally spaced apart and electrically separated from the second signal redistribution pattern. The second ground pattern 120G may be provided on and coupled to the first ground pattern 110G. The second power pattern may be laterally spaced apart and insulated from the second ground pattern 120G and the second signal redistribution pattern. The second power pattern may be configured to be coupled to the first power pattern and to receive the power voltage.

The third conductive patterns 130R and 130S may be provided on surfaces of the second conductive patterns 120R and 120S and may be electrically connected to the second conductive patterns 120R and 120S, respectively. The surfaces of the second conductive patterns 120R and 120S may be top surfaces of the second conducive patterns 120R and 120S. The third conductive patterns 130R and 130S may contact the top surfaces of the second conductive patterns 120R and 120S, respectively. Each of the third conductive patterns 130R and 130S may include a third via portion and a third wire portion. The third via portion may be provided in the dielectric layer 107 that corresponds thereto. The third via portion may contact the top surface of a corresponding one of the second conductive patterns 120R and 120S. The third wire portion may be provided on the third via portion and a top surface of the dielectric layer 107 that corresponds thereto. For example, the third wire portion may be in contact with the top surface of the dielectric layer 107. The third wire portion and the third via portion may be connected to each other without an interface therebetween. For example, the third wire portion and the third via portion may be in material continuity with one another. The third conductive patterns 130R and 130S may include metal, such as copper.

The third conductive patterns 130R and 130S may include third signal patterns 130S and third redistribution patterns 130R. The third signal patterns 130S may be provided on and coupled to the second signal patterns 120S. As illustrated in FIGS. 1A and 1D, the third signal patterns 130S may include a pair of neighboring third signal patterns 130S. The pair of third signal patterns 130S may be still another portion of the signal pair pattern SP. The third signal patterns 130S may be used for transfer of high-speed signals.

The third redistribution patterns 130R may be provided on and coupled to the second redistribution patterns 120R. The third redistribution patterns 130R may be laterally spaced apart and electrically insulated from the third signal patterns 130S. The third redistribution patterns 130R may include a third ground pattern 130G, a third signal redistribution pattern, and a third power pattern. The third signal redistribution pattern may transfer an electric signal different from those transmitted by the third signal patterns 130S. The third ground pattern 130G may be provided on and coupled to the second ground pattern 120G. The third ground pattern 130G may be laterally spaced apart and electrically insulated from the third signal redistribution pattern. The third power pattern may be laterally spaced apart and insulated from the third ground pattern 130G and the third signal redistribution pattern. The third power pattern may be coupled to the second power pattern. The third power pattern may be configured to receive the power voltage.

The conductive pads 150R and 150S may be provided on top surfaces of the third conductive patterns 130R and 130S, respectively. The conductive pads 150R and 150S may be provided in or on the uppermost dielectric layer 107. The conductive pads 150R and 150S may include a metallic material, such as copper. The conductive pads 150R and 150S may include metal, such as copper, nickel, or gold.

The conductive pads 150R and 150S may include signal pads 150S and redistribution pads 150R. The signal pads 150S and the redistribution pads 150R may be respectively disposed on the third signal patterns 130S and the third redistribution patterns 130R. The redistribution pads 150R may include a ground pad 150G. The ground pad 150G may be provided on the third ground pattern 130G.

An electrical connection with the redistribution substrate 100 may include an electrical connection with at least one selected from the first conductive patterns 110R and 110S, the second conductive patterns 120R and 120S, the third conductive patterns 130R and 130S, and the conductive pads 150R and 150S.

The redistribution substrate 100 may include the signal pair pattern SP. The signal pair pattern SP may include a pair of first signal patterns 110S, a pair of second signal patterns 120S, a pair of third signal patterns 130S, and a pair of signal pads 150S. The signal pair pattern SP may be a differential signal pair discussed above. The signal pair pattern SP may have impedance greater than those of other signal patterns in the redistribution substrate 100. Therefore, the signal pair pattern SP may promptly transfer a data signal of the semiconductor chip 200. As illustrated in FIG. 1A, the redistribution substrate 100 may include a plurality of signal pair patterns SP. Each of the signal pair patterns SP may have impedance of about 85Ω to about 115Ω. Because the impedance of each of the signal pair patterns SP is in a range of about 85Ω to about 115Ω, the signal pair pattern SP may have improved electrical properties. For example, the signal pair patterns SP may improve in insertion loss and increase in signal transfer rate. For brevity of description, the following will discuss one signal pair pattern SP.

A pair of third signal patterns 130S may have inner lateral surfaces and outer lateral surfaces. The inner lateral surfaces of the third signal patterns 130S may face each other. The pair of third signal patterns 130S may be spaced apart at a regular interval from the third redistribution patterns 130R. For example, intervals between the third redistribution patterns 130R and different outer lateral surfaces of the pair of third signal patterns 130S may be substantially the same as or similar to each other. As shown in FIGS. 1B and 1C, a first horizontal interval A1 between the third redistribution patterns 130R and a first lateral surface S1 of one of the third signal patterns 130S may be about 90% to about 110% of a second horizontal interval A2 between the third redistribution patterns 130R and a second outer lateral surface S2 of the third signal pattern 130S. The second outer lateral surface S2 of the third signal pattern 130S may be different from the first outer lateral surface S1 of the third signal pattern 130S. The signal pair pattern SP may improve in impedance characteristics and electrical properties.

As illustrated in FIG. 1D, a third horizontal interval A3 between the third signal redistribution patterns and a third outer lateral surface S3 of a pair of third signal patterns 130S may be about 90% to about 110% of a fourth horizontal interval A4 between the third signal redistribution patterns and a fourth outer lateral surface S4 of the pair of third signal patterns 130S. The third and fourth outer lateral surfaces S3 and S4 of the pair of third signal patterns 130S may be opposite to each other. The third horizontal interval A3 depicted in FIG. 1D may be about 90% to about 110% of the first horizontal interval A1 depicted in FIG. 1B and about 90% to about 110% of the second horizontal interval A2 depicted in FIG. 1B. The fourth horizontal interval A4 depicted in FIG. 1D may be about 90% to about 110% of the first horizontal interval A1 depicted in FIG. 1B and of the second horizontal interval A2 depicted in FIG. 1B Therefore, the signal pair pattern SP may improve in impedance characteristics and electrical properties.

The third signal patterns 130S may not vertically overlap the second redistribution patterns 120R. The term "vertically" may mean that "parallel to the third direction D3." For example, the second redistribution patterns 120R may not be interposed between the first conductive patterns 110R and 110S and bottom surfaces of the third signal patterns 130S. Therefore, the occurrence of parasitic capacitance may be prevented between the third signal patterns 130S and the second redistribution patterns 120R.

The second ground pattern 120G may have an opening 129O that penetrates therethrough. For example, the opening 129O may penetrate top and bottom surfaces of the second ground pattern 120G. For example, a portion of the second ground pattern 120G may be removed to form the opening 129O. A cutting process may be performed to remove the portion of the second ground pattern 120G. Alternatively, any method other than the cutting process may be employed to remove the portion of the second ground pattern 120G.

When viewed in plan as shown in FIG. 1A, the opening 129O may overlap a pair of third signal patterns 130S. The opening 129O may have a size greater than that of the pair of third signal patterns 130S. As the second ground pattern 120G has the opening 129O, when viewed in plan, the third signal patterns 130S may not overlap the second ground pattern 120G. Therefore, the occurrence of parasitic capacitance may be prevented between the second ground pattern 120G and the third signal patterns 130S. The signal pair pattern SP may improve in impedance characteristics and electrical properties.

As illustrated in FIGS. 1B to 1D, the opening 129O may expose inner sidewalls 120Gc of the second ground pattern 120G. The inner sidewalls 120Gc of the second ground pattern 120G may be vertically aligned with sidewalls of corresponding third redistribution patterns 130R. The sidewalls of the third redistribution patterns 130R may be directed toward and adjacent to the third signal patterns 130S.

As illustrated in FIGS. 1B and 1C, a first spacing A1' between the first outer lateral surface of one of the third signal patterns 130S and the inner sidewalls 120Gc of the second ground pattern 120G may be about 90% to about 110% of the first horizontal interval A1. For example, the first spacing A1' may be substantially the same as the first horizontal interval A1. A second spacing A2' between the second ground pattern 120G and the second outer lateral surface S2 of the third signal pattern 130S may be about 90% to about 110% of the second horizontal interval A2. For example, the second spacing A2' may be substantially the same as the second horizontal interval A2.

As illustrated in FIG. 1D, a third spacing A3' between the second ground pattern 120G and the third outer lateral surface S3 of the pair of third signal patterns 130S may be about 90% to about 110% of the third horizontal interval A3. For example, the third spacing A3' may be substantially the same as the third horizontal interval A3. A fourth spacing A4' between the second ground pattern 120G and the fourth outer lateral surface S4 of the pair of third signal patterns 130S may be about 90% to about 110% of the fourth horizontal interval A4. For example, the fourth spacing A4' may be substantially the same as the fourth horizontal interval A4. Each of the first, second, third, and fourth spacings A1', A2', A3', and A4' may be an imaginary horizontal interval.

When viewed in plan as shown in FIG. 1A, the third signal patterns 130S may be spaced apart at a regular interval from the inner lateral sidewalls 120Gc of the second ground pattern 120G. For example, intervals between the second ground pattern 120G and different outer lateral surfaces of a pair of third signal patterns 130S may be substantially the same as or similar to each other. For example, the first spacing A1' may be about 90% to about 110% of the second spacing A2', about 90% to about 110% of the third spacing A3', and about 90% to about 110% of the fourth spacing A4'. The second spacing A2' may be about 90% to about 110% of the third spacing A3' and about 90% to about 110% of the fourth spacing A4'. The third spacing A3' may be about 90% to about 110% of the fourth spacing A4'. Therefore, the signal pair pattern SP may improve in impedance characteristics and electrical properties.

The second ground pattern 120G may further have holes 129H. The holes 129H may be spaced apart from the opening 129O. When viewed in plan, the holes 129H may each have a size less than that of the opening 129O. For example, the holes 129H may each have a width less than that of the opening 129O. As illustrated in FIGS. 1B and 1C, neighboring dielectric layers 107 may in contact with each other through the holes 129H. Therefore, even if the second ground pattern 120G has a relatively large planar area, the dielectric layers 107 may be favorably bonded to each other.

Referring to FIGS. 1B to 1D, at least one of the third signal patterns 130S may vertically overlap one of the first conductive patterns 110R and 110S. No conductive components (e.g., the second redistribution patterns 120R) may be provided between the third signal patterns 130S and the one of the first conductive patterns 110R and 110S. A first vertical interval C1 between the third signal patterns 130S and the one of the first conductive patterns 110R and 110S may be greater than the first horizontal interval A1, the second horizontal interval A2, the third horizontal interval A3, and the fourth horizontal interval A4. Therefore, the signal pair pattern SP may improve in impedance characteristics.

As illustrated in FIG. 1C, the redistribution substrate 100 may further include seed patterns 180. The seed patterns 180 may be provided on bottom surfaces of the first conductive patterns 110R and 110S, bottom surfaces of the second conductive patterns 120R and 120S, and bottom surfaces of the third conductive patterns 130R and 130S. Sidewalls of the seed patterns 180 may be vertically aligned with sidewalls of the corresponding first conductive patterns 110R and 110S, the second conductive patterns 120R and 120S, and the third conductive patterns 130R and 130S. The seed patterns 180 may be spaced apart from each other. The seed patterns 180 may not be interposed between the first conductive patterns 110R and 110S and the solder balls 500. The seed patterns 180 may include metal different from those of the first, second, and third conductive patterns 110R, 110S, 120R, 120S, 130R, and 130S. For example, the seed patterns 180 may include one or more of copper, titanium, and any alloy thereof. For brevity of drawings, figures other than FIG. 1C omit illustration of the seed patterns 180, but the present inventive concepts are not intended to exclude the seed patterns 180.

The semiconductor chip 200 may be mounted on the top surface of the redistribution substrate 100. When viewed in plan, the semiconductor chip 210 may be disposed on a central region of the redistribution substrate 100. The semiconductor chip 200 may be one of a logic chip, a buffer chip, and a memory chip. The logic chip may include an applicant specific integrated circuit (ASIC) chip or an application processor (AP) chip. The ASIC chip may include an application specific integrated circuit (ASIC). Alternatively, the semiconductor chip 200 may include a central processing unit (CPU) or a graphic processing unit (GPU).

The semiconductor chip 200 may include chip pads 205 and first integrated circuits (not shown). The first integrated circuits may be provided in the semiconductor chip 200. The chip pads 205 may be provided on a bottom surface of the semiconductor chip 200 and coupled to the first integrated circuits. For example, bottom surfaces of the chip pads 205 may be coplanar with the bottom surface of the semiconductor chip 200. The phrase "a certain component is electrically connected to the semiconductor chip 200" may mean that "a certain component is electrically connected to the first integrated circuits through the chip pads 205 of the semiconductor chip 200."

Conductive bumps 250 may be interposed between the redistribution substrate 100 and the semiconductor chip 200. For example, the conductive bumps 250 may be coupled to the chip pads 205 and the conductive pads 150R and 150S. The conductive bumps 250 may contact the chip pads 205 and the conductive pads 150R and 150S. Therefore, the semiconductor chip 200 may be coupled through the conductive bumps 250 to the redistribution substrate 100. The chip pads 205 may have ground chip pads coupled through the conductive bumps 250 to the first, second, and third ground patterns 110G, 120G, and 130G. The chip pads 205 may have first signal chip pads coupled through the conductive bumps 250 to the first, second, and third signal patterns 110S, 120S, and 130S. The first signal chip pads may be chip pads for transfer of differential signal pairs. The chip pads 205 may have other chip pads coupled through the conductive bumps 250 to the first, second, and third redistribution patterns 110R, 120R, and 130R. The conductive bumps 250 may include a solder material. The conductive bumps 250 may further include pillar patterns, and the pillar patterns may include metal, such as copper. In this case, the pillar patterns may be in contact with the chip pads 205.

An under-fill layer 410 may be provided in a gap between the redistribution substrate 100 and the semiconductor chip 200, thereby covering sidewalls of the conductive bumps 250. The under-fill layer 410 may include a dielectric polymer, such as an epoxy polymer.

The molding layer 400 may be provided on a top surface of the semiconductor chip 200. The molding layer 400 may cover the semiconductor chip 200. The molding layer 400 may include a dielectric polymer, such as an epoxy-based molding compound. The molding layer 400 may include a different material from that of the under-fill layer 410, but the present inventive concepts are not limited thereto.

The semiconductor package 10 may be fabricated by a chip-last process, but the present inventive concepts are not limited thereto.

Figure 2A:
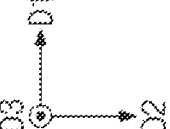
FIG. 2A illustrates a plan view showing first signal patterns and a second ground pattern of a redistribution substrate, according to example embodiments.
Figure 2B:
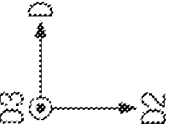
FIG. 2B illustrates a plan view showing second signal patterns and a second ground pattern of a redistribution substrate, according to example embodiments.
Figure 2C:
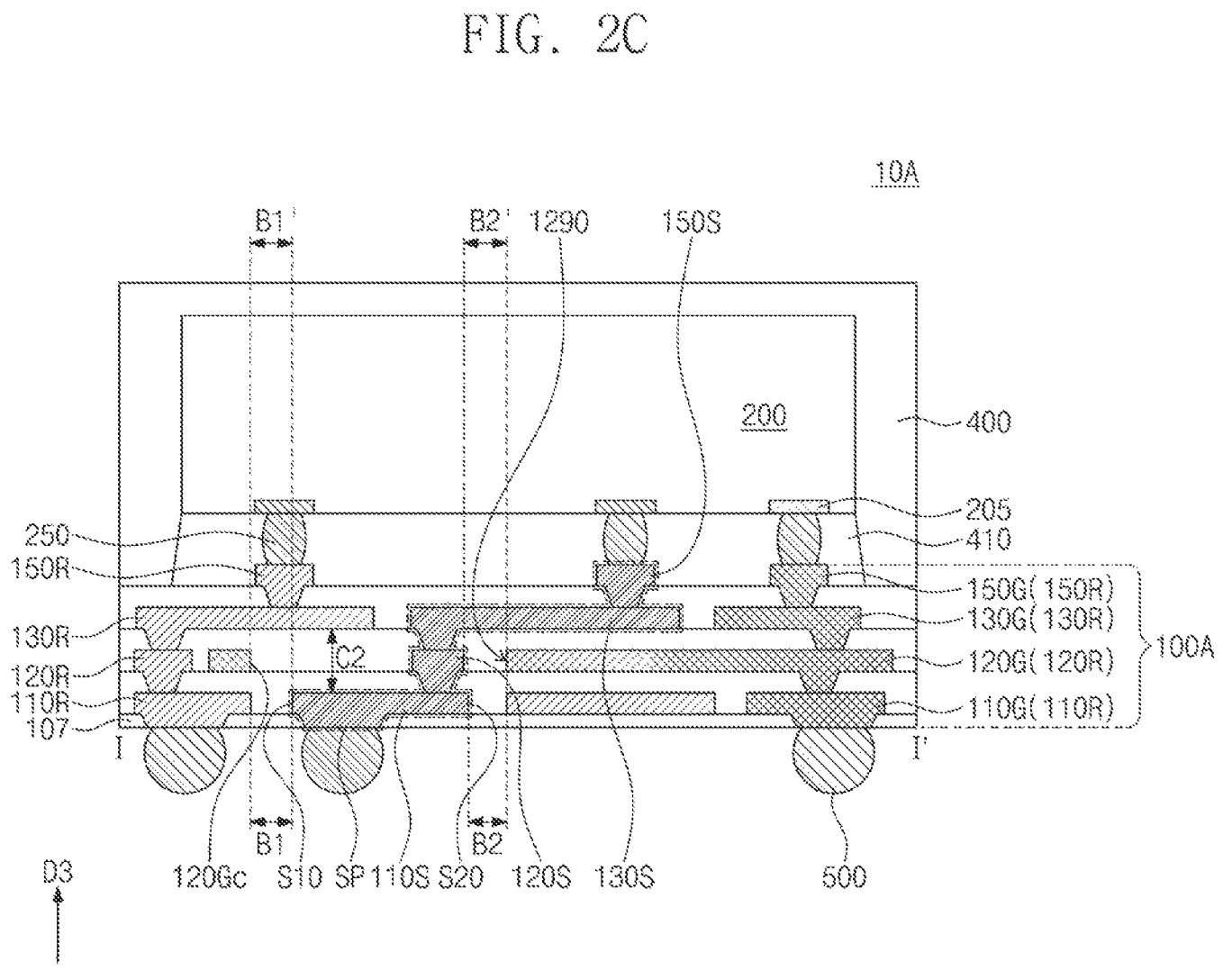
Figure 2D:
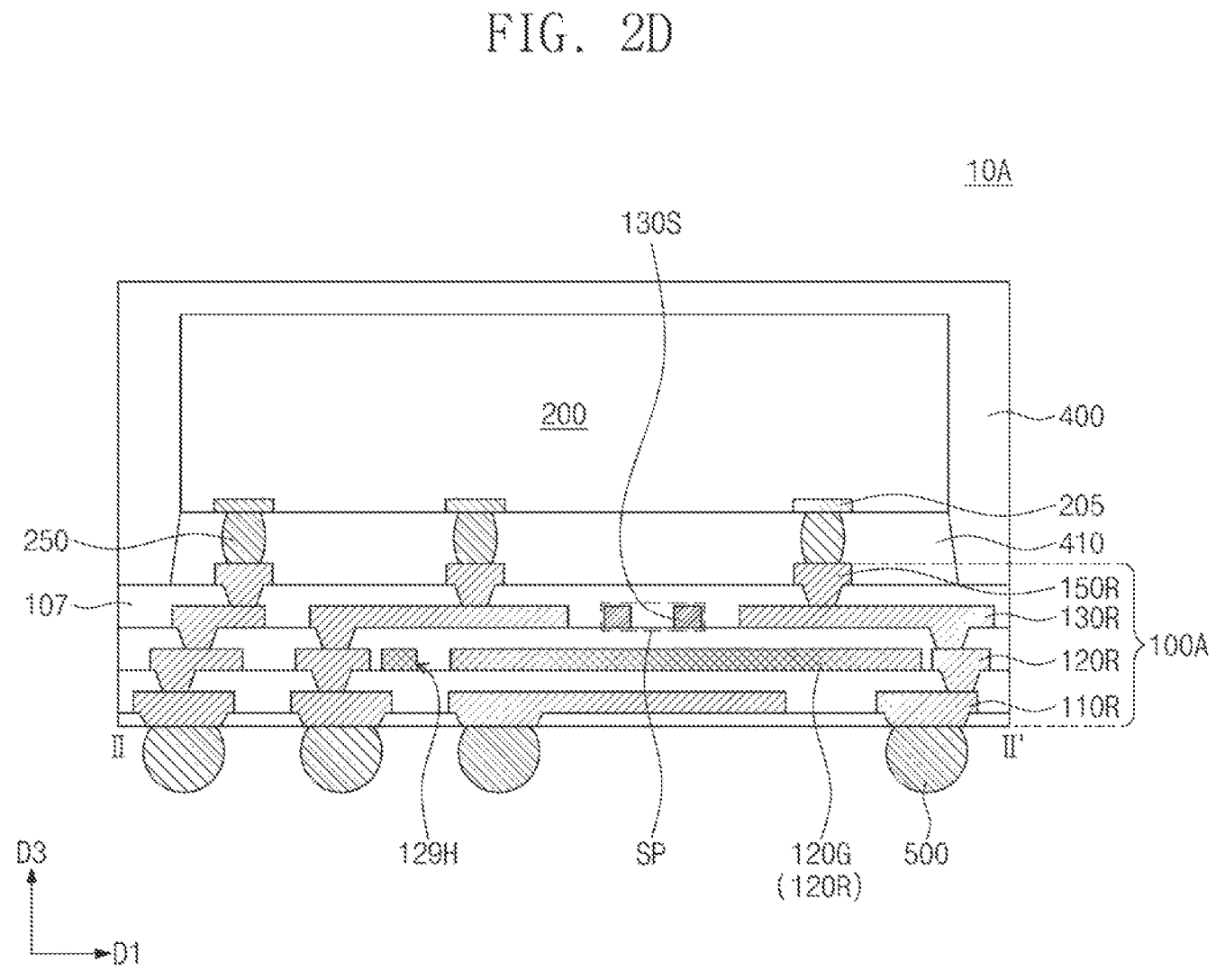

FIG. 2A illustrates a plan view showing first signal patterns and a second ground pattern of a redistribution substrate according to example embodiments. FIG. 2B illustrates a plan view showing second signal patterns and a second ground pattern of a redistribution substrate according to example embodiments. FIG. 2C illustrates a cross-sectional view taken along line I-I' of FIG. 2A. FIG. 2D illustrates a cross-sectional view taken along line II-II' of FIG. 2A. FIGS. 2C and 2D correspond to cross-sectional views respectively taken along lines I-I' and II-II' of FIG. 2B. A description of FIGS. 1E to 1G will be included in the following description of FIGS. 2A to 2D.

Referring to FIGS. 2A to 2D, a semiconductor package 10A may include a redistribution substrate 100A, solder balls 500, semiconductor chip 200, and a molding layer 400. The semiconductor package 10A may further include conductive bumps 250 and an under-fill layer 410. The solder balls 500, the semiconductor chip 200, the conductive bumps 250, the under-fill layer 410, and the molding layer 400 may be substantially the same as those discussed in the examples of FIGS. 1A to 1G.

The redistribution substrate 100A may include a dielectric layer 107, first conductive patterns 110R and 110S, second conductive patterns 120R and 120S, third conductive patterns 130R and 130S, and conductive pads 150R and 150S.

A pair of first signal patterns 110S may have inner lateral surfaces and outer lateral surfaces. The inner lateral surfaces of the first signal patterns 110S may face each other. The pair of first signal patterns 110S may be spaced apart at a regular interval from the first redistribution patterns 110R. For example, intervals between the first redistribution patterns 110R and different outer lateral surfaces of the pair of first signal patterns 110S may be substantially the same as or similar to each other. For example, as shown in FIG. 2C, a first horizontal interval B1 between the first redistribution patterns 110R and a first lateral surface S10 of one of the first signal patterns 110S may be about 90% to about 110% of a second horizontal interval B2 between the first redistribution patterns 110R and a second outer lateral surface S20 of the first signal pattern 110S. The first horizontal interval B1 may be substantially the same as the second horizontal interval B2. The first outer lateral surface S10 of the first signal pattern 110S may be different from the second outer lateral surface S20 of the first signal pattern 110S. As the pair of first signal patterns 110S are spaced apart at a regular interval from the first redistribution patterns 110R, the signal pair pattern SP may improve in impedance characteristics and electrical properties.

The first signal patterns 110S may not vertically overlap the second redistribution patterns 120R. For example, the second redistribution patterns 120R may not be interposed between the third conductive patterns 130R and 130S and top surfaces of the first signal patterns 110S.

According to some embodiments, the second ground pattern 120G may have an opening 129O. When viewed in plan as shown in FIG. 2A, the opening 129O may overlap a pair of first signal patterns 110S. The opening 129O may have a size greater than that of the pair of first signal patterns 110S. As the second ground pattern 120G has the opening 129O, when viewed in plan, the first signal patterns 110S may not overlap the second ground pattern 120G. Therefore, the signal pair pattern SP may improve in impedance characteristics and electrical properties.

As illustrated in FIG. 2B, the opening 129O may expose inner sidewalls 120Gc of the second ground pattern 120G. The inner sidewalls 120Gc of the second ground pattern 120G may be vertically aligned with sidewalls of corresponding first redistribution patterns 110R. The sidewalls of the first redistribution patterns 110R may be directed toward and adjacent to the first signal patterns 110S.

When viewed in plan, the first signal patterns 110S may be spaced apart at a regular interval from the inner sidewalls 120Gc of the second ground pattern 120G. For example, when viewed in plan, intervals between the second ground pattern 120G and different outer lateral surfaces of the pair of first signal patterns 110S may be substantially the same as or similar to each other. When viewed in plan, a fifth spacing B1' between the second ground pattern 120G and the first lateral surface S10 of one of the first signal patterns 110S may be about 90% to about 110% of the first horizontal interval B1. For example, the fifth spacing B1' may be substantially the same as the first horizontal interval B1.

When viewed in plan, a sixth spacing B2' between second ground pattern 120G and the second outer lateral surface S20 of the first signal pattern 110S may be about 90% to about 110% of the second horizontal interval B2. For example, the sixth spacing B2' may be substantially the same as the second horizontal interval B2.

As illustrated in FIG. 2A, a seventh spacing B3' between the second ground pattern 120G and a third outer lateral surface of a pair of first signal patterns 110S may be about 90% to about 110% of the fifth spacing B1' and about 90% to about 110% of the sixth spacing B2'. The third outer lateral surface of the pair of first signal patterns 110S may be different from the first outer lateral surface S10 and the second outer lateral surface S20. Therefore, the signal pair pattern SP may improve in impedance characteristics and electrical properties. The fifth spacing B1', the sixth spacing B2', and the seventh spacing B3' may be imaginary horizontal intervals.

The second ground pattern 120G may have holes 129H. The holes 129H may be substantially the same as those discussed in the examples of FIGS. 1A, 1D, and 1F.

As illustrated in FIG. 2C, at least one of the first signal patterns 110S may vertically overlap one of the third conductive patterns 130R and 130S. No conductive components may be provided between the first signal patterns 110S and the one of the third conductive patterns 130R and 130S. For example, the second redistribution patterns 120R may not interposed between the first signal patterns 110S and the one of the third conductive patterns 130R and 130S. A second vertical interval C2 between the first signal patterns 110S and the one of the third conductive patterns 130R and 130S may be greater than the first horizontal interval B1 and the second horizontal interval B2. Therefore, the signal pair pattern SP may improve in impedance characteristics.

Figure 3A:
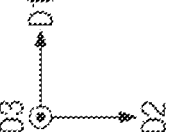
FIG. 3A illustrates a plan view showing first signal patterns, a second ground pattern, and third signal patterns of a redistribution substrate, according to example embodiments.
Figure 3B:
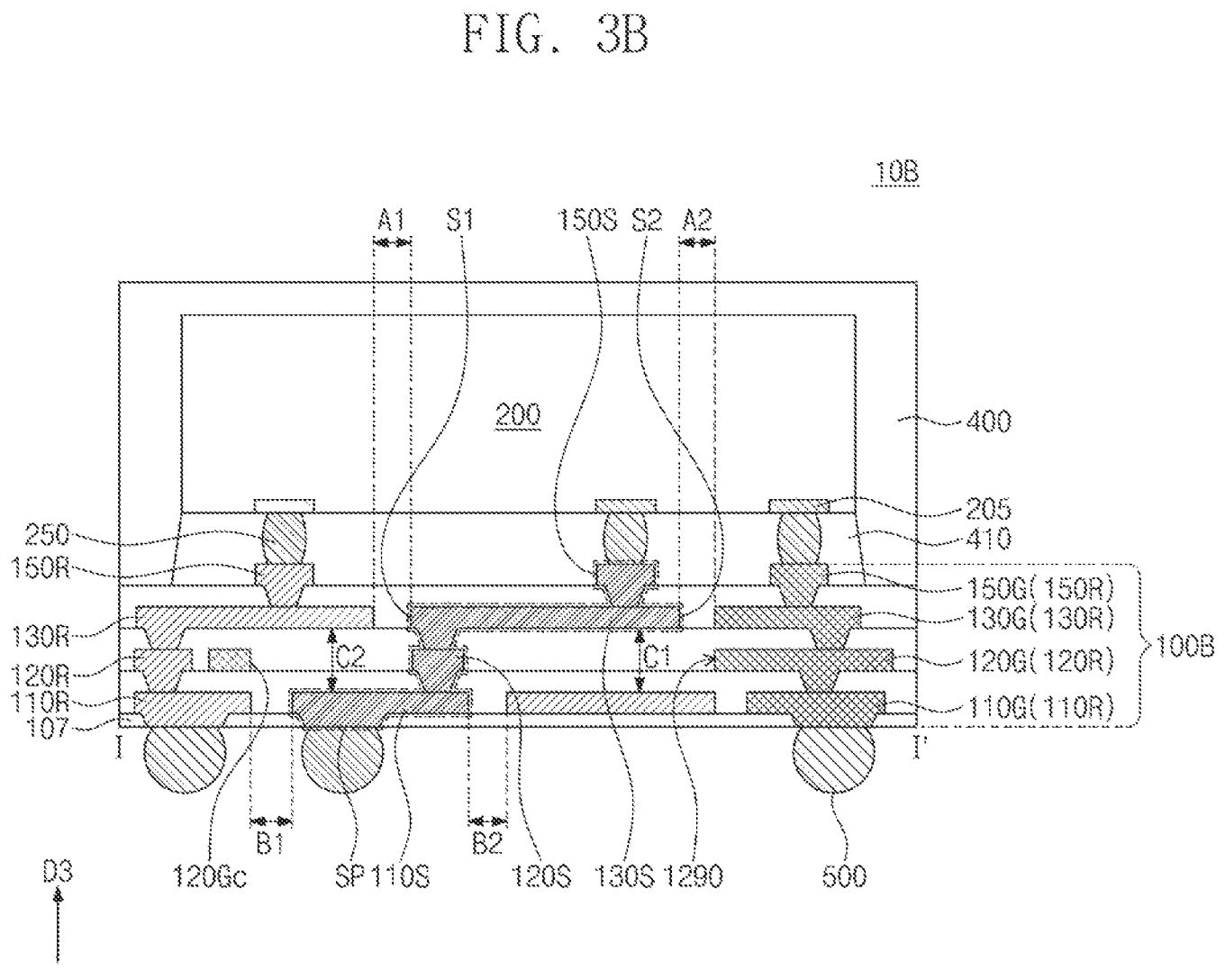
Figure 3C:
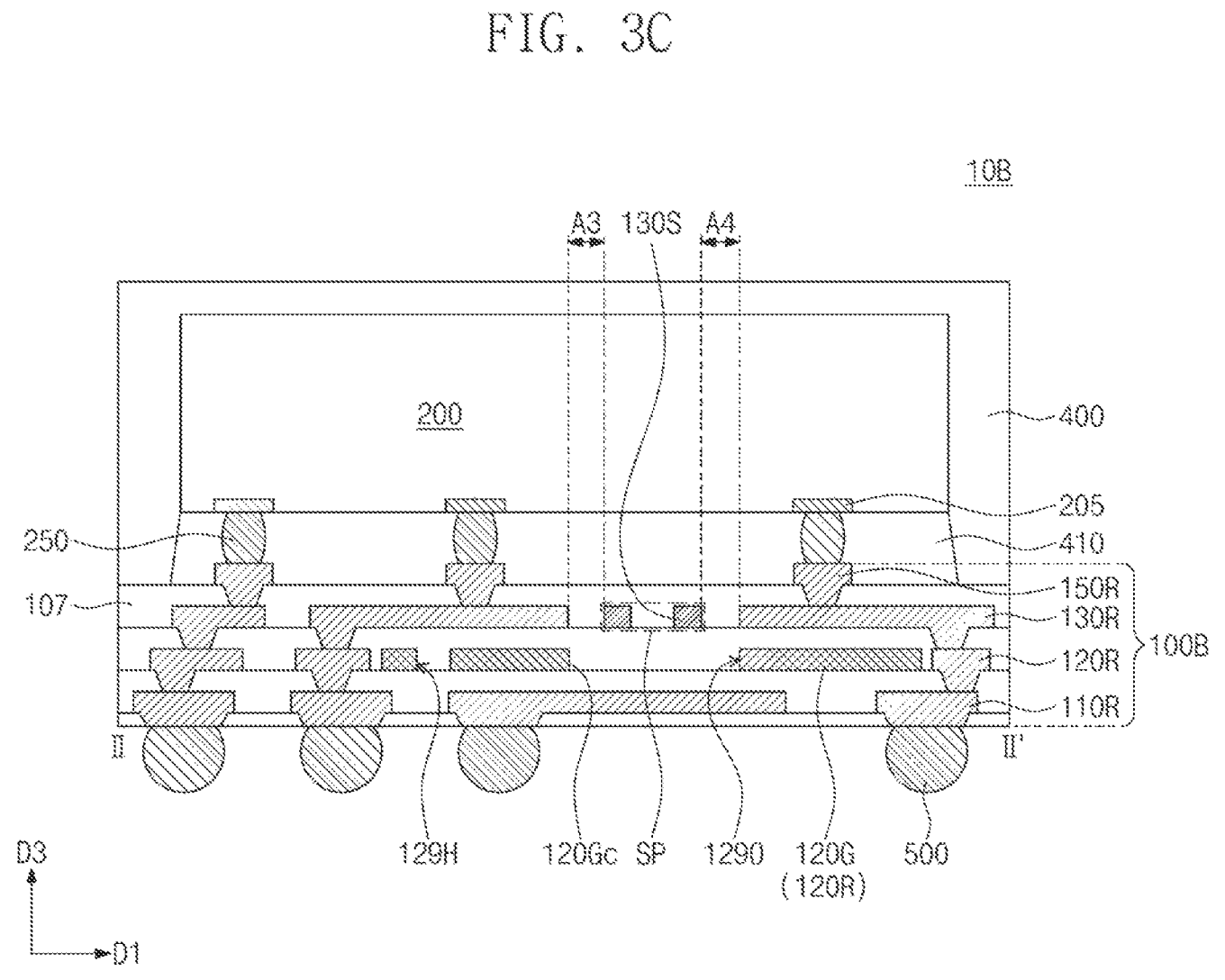

FIG. 3A illustrates a plan view showing first signal patterns, a second ground pattern, and third signal patterns of a redistribution substrate according to example embodiments. FIG. 3B illustrates a cross-sectional view taken along line I-I' of FIG. 3A. FIG. 3C illustrates a cross-sectional view taken along line II-II' of FIG. 3A. A description of FIGS. 1E and 1G will be included in the following description of FIGS. 3A to 3C.

Referring to FIGS. 3A to 3C, a semiconductor package 10B may include a redistribution substrate 100B, solder balls 500, a semiconductor chip 200, and a molding layer 400.

The redistribution substrate 100B may include a dielectric layer 107, first conductive patterns 110R and 110S, second conductive pattern 120R and 120S, third conductive patterns 130R and 130S, and conductive pads 150R and 150S. A pair of first signal patterns 110S may be spaced apart at a regular interval from the first redistribution patterns 110R. For example, a first horizontal interval B1 may be about 90% to about 110% of a second horizontal interval B2. The first horizontal interval B1 and the second horizontal interval B2 may be greater than a second vertical interval C2.

A pair of third signal patterns 130S may be spaced apart at a regular interval from the third redistribution patterns 130R. A first horizontal interval A1, a second horizontal interval A2, a third horizontal interval A3, a fourth horizontal interval A4, and a first vertical interval C1 may be the same as those discussed in the examples of FIGS. 1A to 1D. For example, one of the first, second, third, and fourth horizontal intervals A1, A2, A3, and A4 may be about 90% to 110% of another of the first, second, third, and fourth horizontal intervals A1, A2, A3, and A4. Each of the first, second, third, and fourth horizontal intervals A1, A2, A3, and A4 may be greater than the first vertical interval C1.

According to some embodiments, the second ground pattern 120G may have an opening 129O that does not vertically overlap a corresponding signal pair pattern SP. An arrangement relation between the second ground pattern 120G and the first conductive patterns 110R and 110S may be substantially the same as that discussed in the examples of FIGS. 2A to 2D. An arrangement between the second ground pattern 120G and the third conductive patterns 130R and 130S may be substantially the same as that discussed in the examples of FIGS. 1A to 1G. For example, when viewed in plan, the opening 129O may vertically overlap neither a pair of first signal patterns 110S or a pair of third signal patterns 130S. Therefore, when viewed in plan, the second ground pattern 120G may be spaced apart from the pair of first signal patterns 110S and the pair of third signal patterns 130S. The signal pair pattern SP may improve in impedance characteristics and electrical properties.

The opening 129O may expose inner sidewalls 120Gc of the second ground pattern 120G. Each of the inner sidewalls 120Gc of the second ground pattern 120G may be vertically aligned with a corresponding one of sidewalls of the first redistribution patterns 110R or a corresponding one of sidewalls of the third redistribution patterns 130R.

Figure 4:
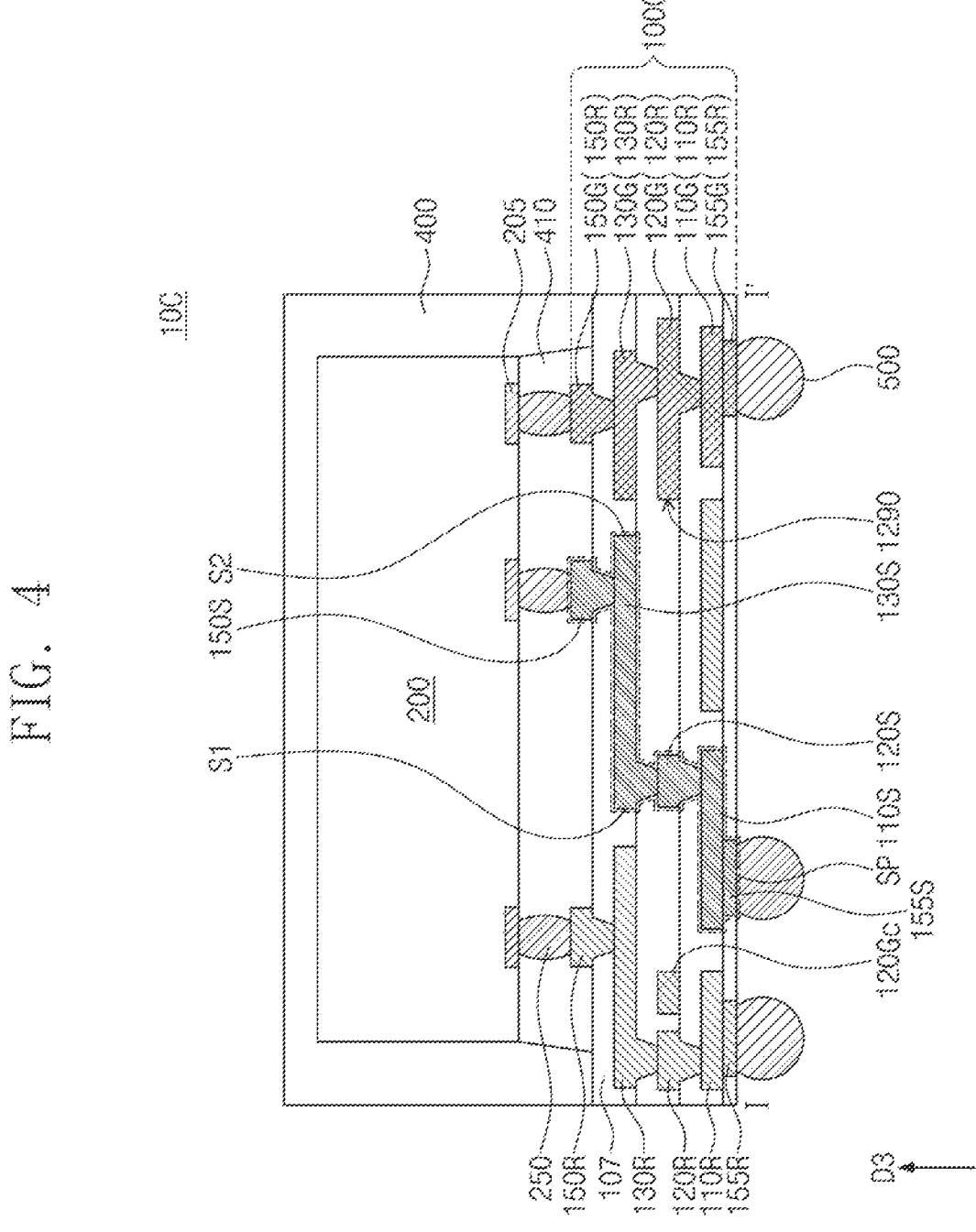
FIG. 4 illustrates a cross-sectional view showing a semiconductor package, according to example embodiments.

FIG. 4 illustrates a cross-sectional view taken along line I-I' of FIG. 3A, showing a semiconductor package according to example embodiments.

Referring to FIG. 4, a semiconductor package 10C may include a redistribution substrate 100C, solder balls 500, a semiconductor chip 200, and a molding layer 400. For example, the redistribution substrate 100C may include a dielectric layer 107, first conductive patterns 110R and 110S, second conductive patterns 120R and 120S, third conductive patterns 130R and 130S, and conductive pads 150R and 150S. The dielectric layer 107, the first conductive patterns 110R and 110S, the second conductive patterns 120R and 120S, the third conductive patterns 130R and 130S, and the conductive pads 150R and 150S may be substantially the same as those discussed in the examples of FIGS. 3A to 3C. Alternatively, the first conductive patterns 110R and 110S, the second conductive patterns 120R and 120S, and the third conductive patterns 130R and 130S may be substantially the same as those discussed in the examples of FIGS. 1A to 1G or FIGS. 2A to 2D. In contrast, the first conductive patterns 110R and 110S may be provided on a top surface of the lowermost dielectric layer 107, and may not extend into the lowermost dielectric layer 107. The first conductive patterns 110R and 110S may not be in direct contact with the solder balls 500.

The redistribution substrate 100C may further include under-bump patterns 155R and 155S. The under-bump patterns 155R and 155S may be provided in the lowermost dielectric layer 107. The under-bump patterns 155R and 155S may be provided between the solder balls 500 and the first conductive patterns 110R and 110S. The under-bump patterns 155R and 155S may include redistribution under-bump patterns 155R and a signal under-bump pattern 155S. The signal under-bump pattern 155S may be provided on a bottom surface of the first signal pattern 110S that corresponds thereto. The redistribution under-bump patterns 155R may be provided on bottom surfaces of the first redistribution patterns 110R. The under-bump patterns 155R and 155S may include a ground under-bump pattern 155G. The ground under-bump pattern 155G may be provided on a bottom surface of the first ground pattern 110G.

Figure 5:
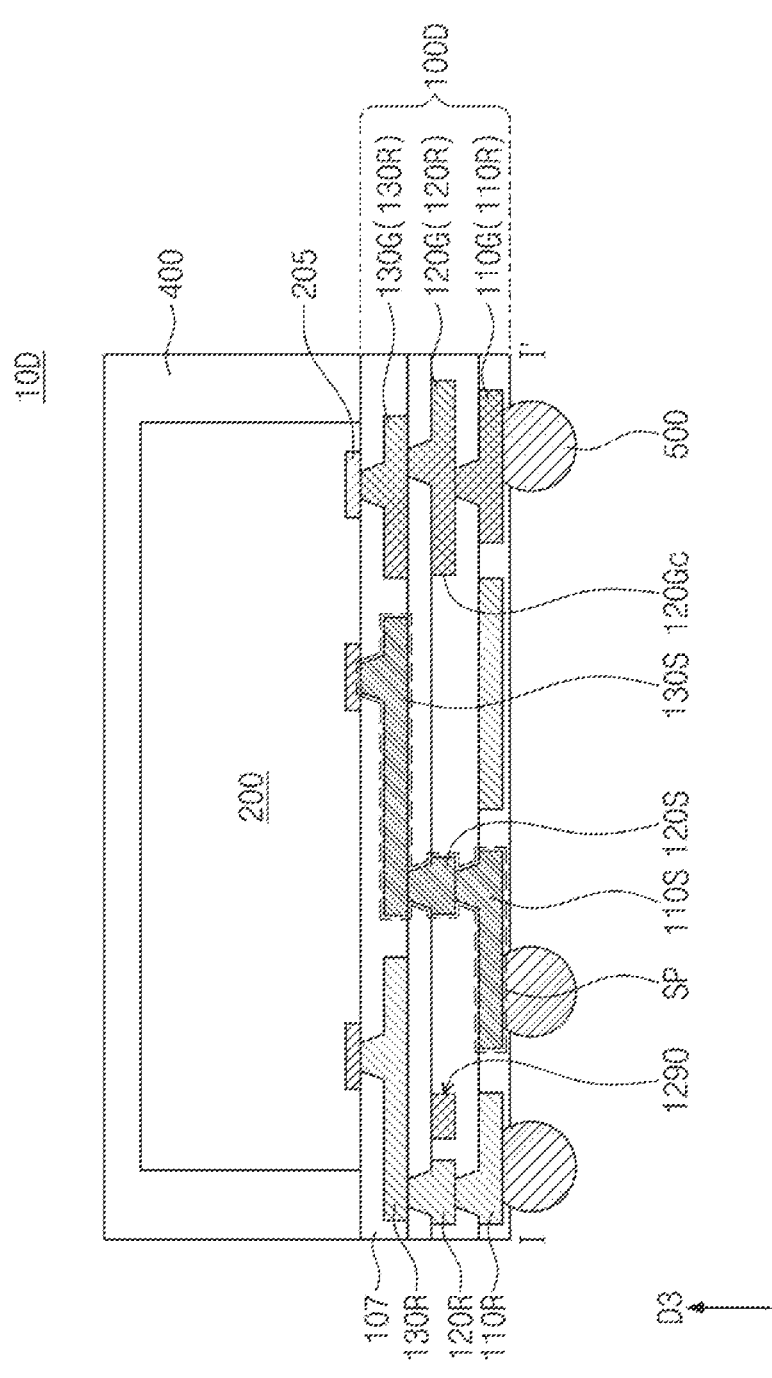
FIG. 5 illustrates a cross-sectional view showing a semiconductor package, according to example embodiments.

FIG. 5 illustrates a cross-sectional view taken along line I-I' of FIG. 3A, showing a semiconductor package according to example embodiments.

Referring to FIG. 5, a semiconductor package 10D may include a redistribution substrate 100D, solder balls 500, a semiconductor chip 200, and a molding layer 400. In contrast, the semiconductor package 10D may include neither the conductive bumps 250 nor the under-fill layer 410 discussed in the examples of FIGS. 1B to 1D.

The redistribution substrate 100D may include a dielectric layer 107, first conductive patterns 110R and 110S, second conductive patterns 120R and 120S, and third conductive patterns 130R and 130S. The dielectric layer 107, the first conductive patterns 110R and 110S, the second conductive patterns 120R and 120S, and the third conductive patterns 130R and 130S may be substantially the same as those discussed in the examples of FIGS. 3A to 3C. Alternatively, the first conductive patterns 110R and 110S, the second conductive patterns 120R and 120S, and the third conductive patterns 130R and 130S may be substantially the same as those discussed in the examples of FIGS. 1A to 1G or FIGS. 2A to 2C. However, the redistribution substrate 100D may not include the conductive pads 150R and 150S.

The redistribution substrate 100D may be in direct contact with the semiconductor chip 200 and the molding layer 400. For example, the uppermost dielectric layer 107 may be directly in physical contact with a bottom surface of the semiconductor chip 200 and a bottom surface of the molding layer 400. The third conductive patterns 130R and 130S may be directly coupled to the chip pads 205. Each of the third conductive patterns 130R and 130S may include a third wire portion and a third via portion that is provided in the uppermost dielectric layer 107 and is on a top surface of the third wire portion. Each of the second conductive patterns 120R and 120S may include a second wire portion and a second via portion that is provided on a top surface of the second wire portion. Each of the first conductive patterns 110R and 110S may include a first wire portion and a first via portion that is provided on a top surface of the first wire portion.

The solder balls 500 may be provided on bottom surfaces of the first conductive patterns 110R and 110S. For example, the solder balls 500 may be in direct contact with bottom surfaces of the first conductive patterns 110R and 110S. Alternatively, under-bump patterns (see under-bump patterns 155R and 155S of FIG. 4) may further be interposed between the solder balls 500 and the first conductive patterns 110R and 110S.

The semiconductor package 10D may be fabricated by a chip-first process, but the present inventive concepts are not limited thereto.

Figure 6:
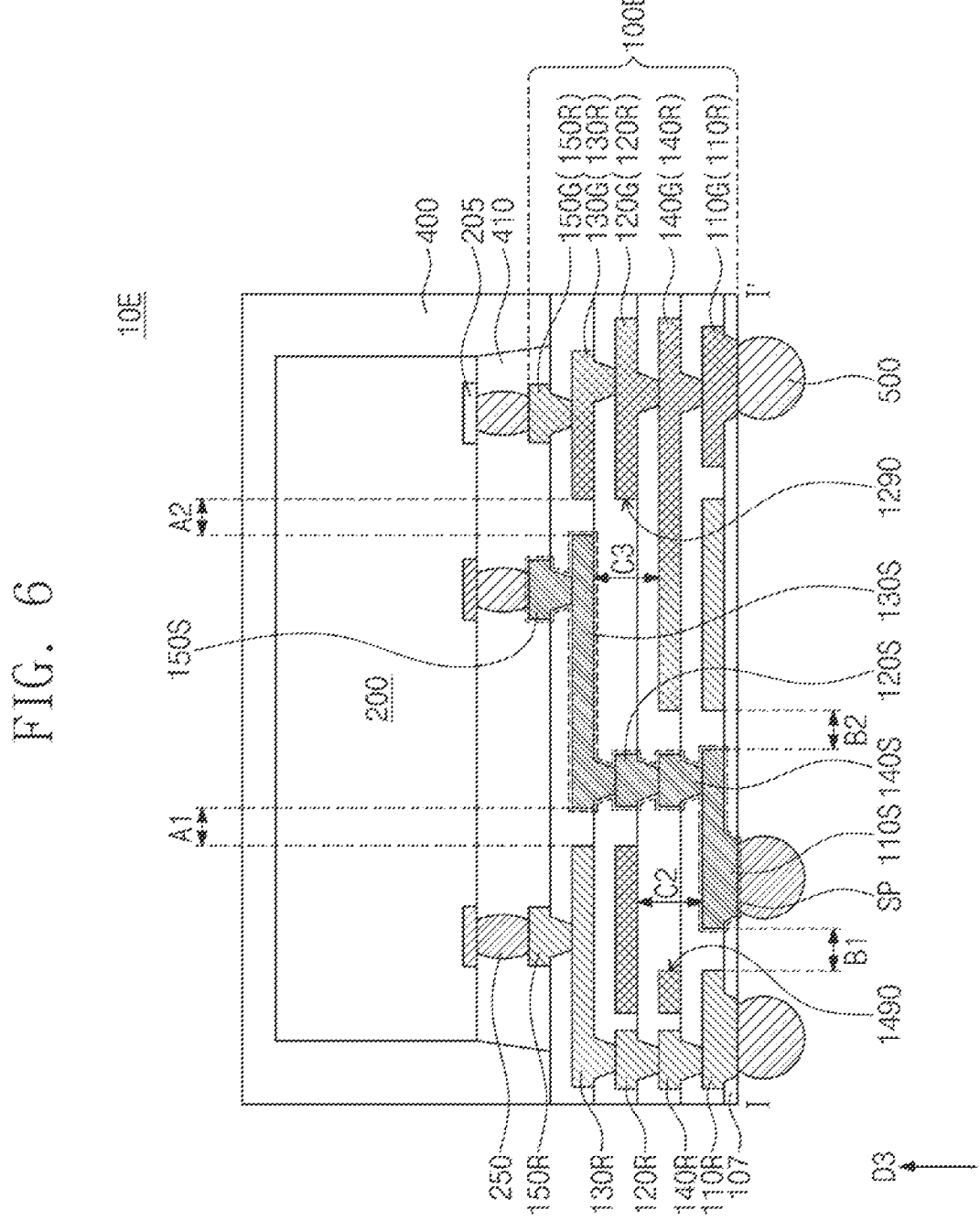
FIG. 6 illustrates a cross-sectional view showing a semiconductor package, according to example embodiments.

FIG. 6 illustrates a cross-sectional view taken along line I-I' of FIG. 3A, showing a semiconductor package according to example embodiments.

Referring to FIG. 6, a semiconductor package 10E may include a redistribution substrate 100E, solder balls 500, a semiconductor chip 200, and a molding layer 400. The semiconductor package 10E may further include conductive bumps 250 and an under-fill layer 410.

The redistribution substrate 100E may include a dielectric layer 107, first conductive patterns 110R and 110S, second conductive patterns 120R and 120S, third conductive patterns 130R and 130S, and conductive pads 150R and 150S, and may further include fourth conductive patterns 140R and 140S. The first conductive patterns 110R and 110S, the second conductive patterns 120R and 120S, and the third conductive patterns 130R and 130S may be substantially the same as or similar to those discussed in the examples of FIGS. 1A to 1G.

The fourth conductive patterns 140R and 140S may be interposed between the first conductive patterns 110R and 110S and the second conductive patterns 120R and 120S, respectively. The fourth conductive patterns 140R and 140S may each include a fourth via portion and a fourth wire portion. The fourth via portion may be provided in a corresponding dielectric layer 107. The fourth via portion may contact a top surface of a corresponding one of the first conductive patterns 110R and 110S. The fourth wire portion may be provided on a top surface of the corresponding dielectric layer 107. For example, the fourth wire portion may be in contact with the top surface of the dielectric layer 107. The fourth via portion and the fourth wire portion may be connected to each other without an interface therebetween. For example, the fourth wire portion and the fourth via portion may be in material continuity with one another. The fourth conductive patterns 140R and 140S may include metal, such as copper.

The fourth conductive patterns 140R and 140S may include fourth signal patterns 140S and fourth redistribution patterns 140R. The fourth signal pattern 140S may be provided between and coupled to a corresponding first signal pattern 110S and corresponding third signal patterns 130S. Although not shown, the fourth signal pattern 140S may include a pair of neighboring fourth signal patterns 140S. The pair of fourth signal patterns 140S may be a portion of the signal pair pattern SP. For example, the signal pair pattern SP may include first, second, third, and fourth signal patterns 110S, 120S, 130S, and 140S. A planar arrangement of the pair of fourth signal patterns 140S may be substantially the same as that of the pair of second signal patterns 120S depicted in FIG. 1F. However, the planar arrangement of the pair of fourth signal patterns 140S is variously changed without being limited thereto.

The fourth redistribution patterns 140R may be provided between and coupled to the first redistribution patterns 110R and the third redistribution patterns 130R. The fourth redistribution patterns 140R may be laterally spaced apart and electrically insulated from the fourth signal pattern 140S. The fourth redistribution patterns 140R may not vertically overlap the first signal pattern 110S.

The fourth redistribution patterns 140R may include fourth signal redistribution patterns and/or a fourth ground pattern 140G. The fourth signal redistribution pattern may transfer an electric signal different from that transmitted by the fourth signal pattern 140S.

The fourth ground pattern 140G may be interposed between the first ground pattern 110G and the third ground pattern 130G. The fourth ground pattern 140G may be laterally spaced apart from the fourth signal redistribution pattern. The fourth ground pattern 140G may have a lower opening 149O. For example, the lower opening 149O may penetrate top and bottom surfaces of the fourth ground pattern 140G. A planar arrangement of the fourth ground pattern 140G, the lower opening 149O, and the first signal pattern 110S may be substantially the same as that of the second ground pattern 120G, the opening 129O, and the first signal pattern 110S, respectively, depicted in FIG. 2A. For example, when viewed in plan, the lower opening 149O may overlap the fourth signal pattern 140S. When viewed in plan, the lower opening 149O may have a size greater than that of the fourth signal pattern 140S. As the fourth ground pattern 140G has the lower opening 149O, the first signal patterns 110S may not vertically overlap the fourth ground pattern 140G. A first horizontal interval B1 and a second horizontal interval B2 may be greater than a second vertical interval C2. Therefore, the signal pair pattern SP may improve in impedance characteristics and electrical properties. The first horizontal interval B1, the second horizontal interval B2, and the second vertical interval C2 may be substantially the same as those discussed in the examples of FIGS. 2A to 2D.

The lower opening 149O may expose inner sidewalls of the fourth ground pattern 140G. The inner sidewalls of the fourth ground pattern 140G may be vertically aligned with sidewalls of the first redistribution patterns 110R. The sidewalls of the first redistribution patterns 110R may be directed toward and adjacent to the first signal pattern 110S.

The fourth ground pattern 140G may not vertically overlap any of the first and third signal patterns 110S and 130S. Alternatively, the fourth ground pattern 140G may vertically overlap one of the first and third signal patterns 110S and 130S, and may not overlap the other of the first and third signal patterns 110S and 130S. Dissimilarly, the fourth ground pattern 140G may vertically overlap the first and third signal patterns 110S and 130S.

The third signal patterns 130S may not vertically overlap the second redistribution patterns 120R and may vertically overlap the fourth redistribution patterns 140R. A third vertical interval C3 between the third signal patterns 130S and the fourth redistribution patterns 140R may be greater than the first horizontal interval A1 and the second horizontal interval A2.

According to some embodiments, the second ground pattern 120G may not vertically overlap any of the third and fourth signal patterns 130S and 140S. Alternatively, the third ground pattern 130G may vertically overlap one of the third and fourth signal patterns 130S and 140S, and may not vertically overlap the other of the third and fourth signal patterns 130S and 140S. Dissimilarly, the second ground pattern 120G may vertically overlap the third and fourth signal patterns 130S and 140S.

Figure 7:
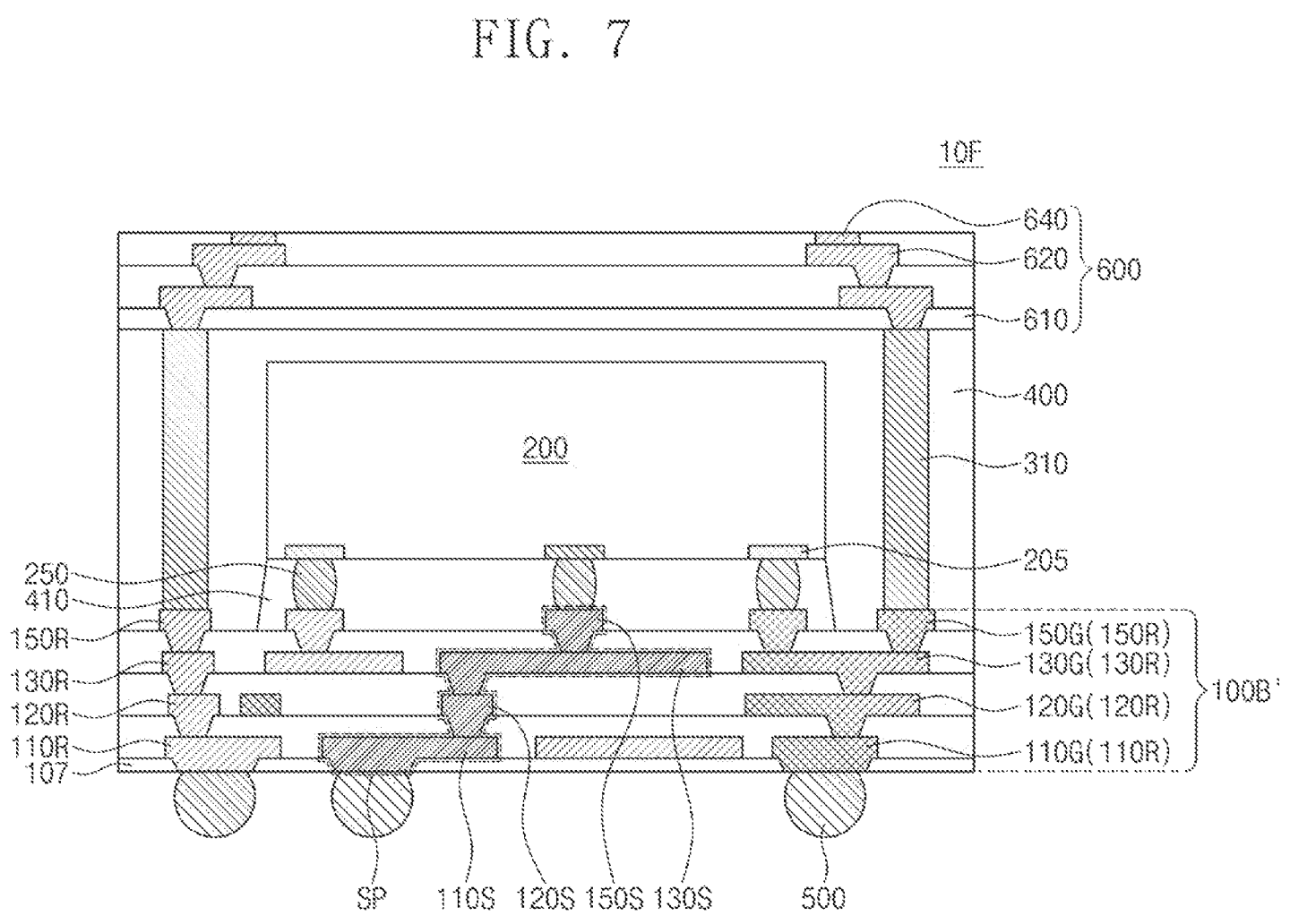

FIG. 7 illustrates a cross-sectional view showing a semiconductor package according to example embodiments.

Referring to FIG. 7, a semiconductor package 10F may be a lower semiconductor package. The semiconductor package 10F may include a redistribution substrate 100B', solder balls 500, a semiconductor chip 200, a conductive structure 310, and a molding layer 400. The semiconductor package 10F may further include conductive bumps 250 and an under-fill layer 410. The redistribution substrate 100B' may be substantially the same as the redistribution substrate 100B of FIGS. 3A to 3C. Alternatively, the redistribution substrate 100B' may be substantially the same as the redistribution substrate 100 of FIGS. 1A to 1G, the redistribution substrate 100A of FIGS. 2A to 2D, the redistribution substrate 100C of FIG. 4C, the redistribution substrate 100D of FIG. 5, or the redistribution substrate 100E of FIG. 6.

The conductive structure 310 may be disposed on the redistribution substrate 100B and coupled to a corresponding one of conductive pads 150R and 150S. When viewed in plan, the conductive structure 310 may be provided on an edge region of the redistribution substrate 100B'. The conductive structure 310 may be disposed laterally spaced apart from the semiconductor chip 200. A metal pillar may be provided on the redistribution substrate 100B' to form the conductive structure 310. For example, the conductive structure 310 may be a metal pillar. The conductive structure 310 may be electrically connected through the redistribution substrate 100B' to the semiconductor chip 200 or the solder balls 500. The conductive structure 310 may include metal, such as copper. The conductive structure 310 may include a plurality of conductive structures that are spaced apart from each other. For brevity of description, the following will discuss a single conductive structure 310.

The molding layer 400 may cover sidewalls of the conductive structure 310. The molding layer 400 may have an outer sidewall aligned with that of the redistribution substrate 100B'. The molding layer 400 may expose a top surface of the conductive structure 310. For example, the top surface of the conductive structure 310 may be coplanar with a top surface of the molding layer 400.

The semiconductor package 10F may further include an upper redistribution layer 600. The upper redistribution layer 600 may be provided on a top surface of the molding layer 400 and a top surface of the conductive structure 310. A lower surface of the upper redistribution layer 600 may contact the top surfaces of the molding layer 400 and the conductive structure 310. The upper redistribution layer 600 may include upper dielectric layers 610, upper redistribution patterns 620, and upper bonding pads 640. The upper dielectric layers 610 may be stacked on the molding layer 400. The upper dielectric layers 610 may include an organic material, such as a photo-imageable polymer or a solder resist. Each of the upper redistribution patterns 620 may include a via portion and a wire portion. The via portion of each of the upper redistribution patterns 620 may be provided in a corresponding upper dielectric layer 610. The wire portion of each of the upper redistribution patterns 620 may be provided between the upper dielectric layers 610. For example, the wire portion of each of the upper redistribution patterns 620 may be in contact with the top surface of a corresponding one of the upper dielectric layers 610. The via portion and the wire portion of each of the upper redistribution patterns 620 may be connected to each other without an interface therebetween. For example, the via portion and the wire portion of each of the upper redistribution patterns 620 may be in material continuity with one another. The upper redistribution patterns 620 may include metal, such as copper. At least one of the upper redistribution patterns 620 may be in contact with a top surface of the conductive structure 310 that corresponds thereto. The upper bonding pads 640 may be disposed on or in an uppermost one of the upper dielectric layers 610 and may be coupled to the upper redistribution patterns 620. The upper bonding pads 640 may be electrically connected through the upper redistribution patterns 620 and the conductive structures 310 to the solder balls 500 or the semiconductor chip 200. As the upper redistribution patterns 620 are provided, at least one of the upper bonding pads 640 may not be vertically aligned with the conductive structure 310 electrically connected thereto.

Figure 8:
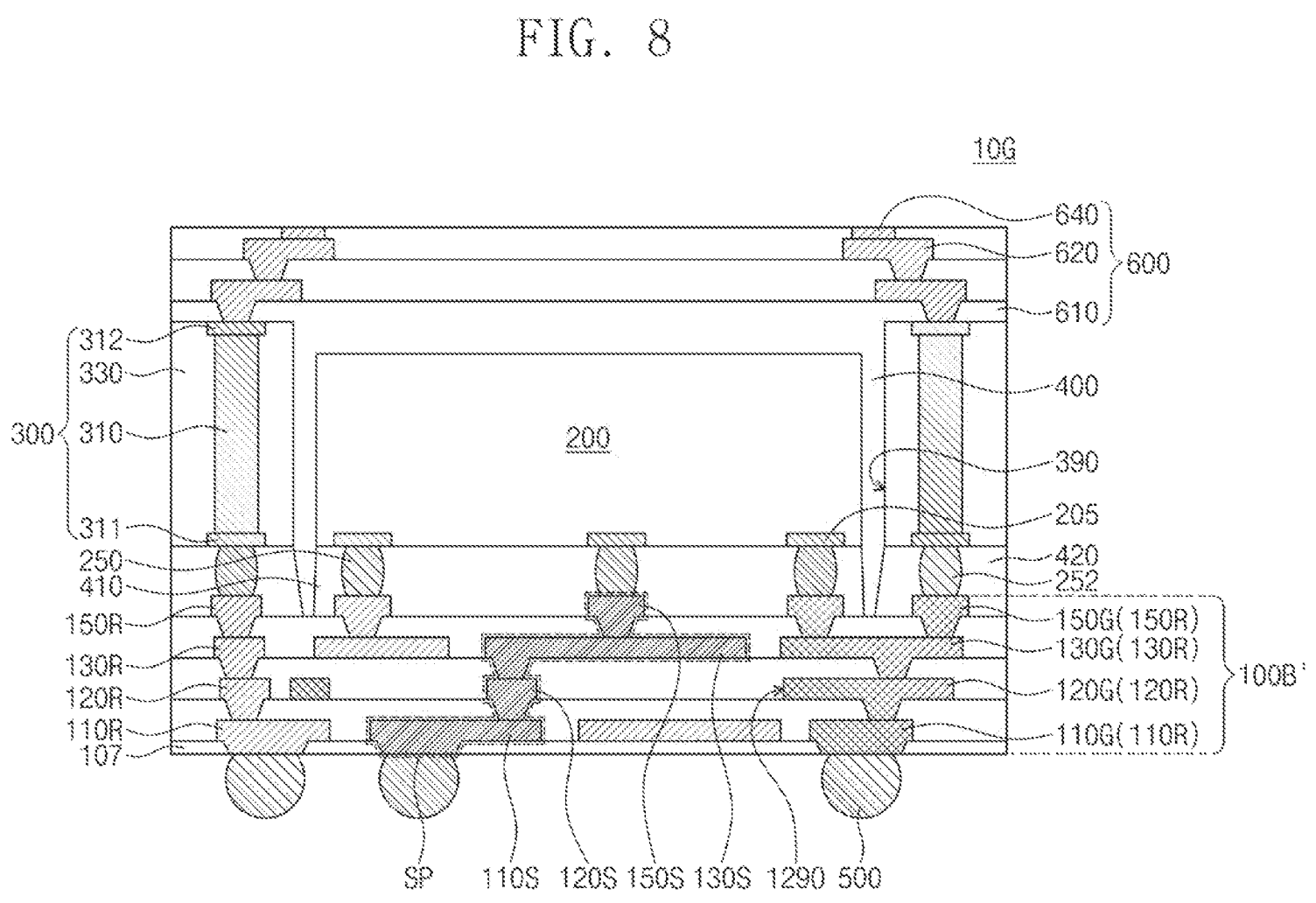

FIG. 8 illustrates a cross-sectional view showing a semiconductor package according to example embodiments.

Referring to FIG. 8, a semiconductor package 10G may be a lower semiconductor package. The semiconductor package 10G may include a redistribution substrate 100B', solder balls 500, a semiconductor chip 200, a connection substrate 300, and a molding layer 400. The semiconductor package 10G may further include at least one selected from conductive bumps 250, an under-fill layer 410, a connection bump 252, and an under-fill pattern 420. The redistribution substrate 100B' may be substantially the same as the redistribution substrate 100B of FIGS. 3A to 3C. Alternatively, the redistribution substrate 100B' may be substantially the same as the redistribution substrate 100 of FIGS. 1A to 1G, the redistribution substrate 100A of FIGS. 2A to 2D, the redistribution substrate 100D of FIG. 5, or the redistribution substrate 100E of FIG. 6.

The connection substrate 300 may be disposed on the redistribution substrate 100B'. The connection substrate 300 may have a substrate hole 390 that penetrates therethrough. For example, the substrate hole 390 may be formed to penetrate top and bottom surfaces of a printed circuit board, which may manufacture the connection substrate 300. When viewed in plan, the substrate hole 390 may be formed on a central portion of the redistribution substrate 100B'. The semiconductor chip 200 may be disposed in the substrate hole 390 of the connection substrate 300. The semiconductor chip 200 may be disposed spaced apart from an inner sidewall of the connection substrate 300.

The connection substrate 300 may include a base layer 330 and a conductive structure 310. The substrate hole 390 may penetrate the base layer 330. Differently from that shown, in some embodiments, the base layer 330 may include a plurality of stacked layers. The base layer 330 may include a dielectric material. For example, the base layer 330 may include a carbon-based material, a ceramic, or a polymer. The conductive structure 310 may be provided in the base layer 330. The connection substrate 300 may further include a first pad 311 and a second pad 312. The first pad 311 may be disposed on a bottom surface of the conductive structure 310. The second pad 312 may be disposed on a top surface of the conductive structure 310. The second pad 312 may be electrically connected through the conductive structure 310 to the first pad 311. The conductive structure 310, the first pad 311, and the second pad 312 may include, for example, at least one selected from copper, aluminum, tungsten, titanium, tantalum, iron, and any alloy thereof.

The connection bump 252 may be disposed between the redistribution substrate 100B' and the connection substrate 300. The connection bump 252 may be interposed between and coupled to the first pad 311 and a corresponding one of conductive pads 150R and 150S. The conductive structure 310 may be electrically connected through the connection bump 252 to the redistribution substrate 100B'. The connection bump 252 may include at least one selected from a solder ball, a bump, and a pillar. The connection bump 252 may include a metallic material. The under-fill pattern 420 may be provided in a gap between the redistribution substrate 100B' and the connection substrate 300, thereby encapsulating the connection bump 252. The under-fill pattern 420 may include a dielectric polymer.

The molding layer 400 may be provided on the semiconductor chip 200 and the connection substrate 300. The molding layer 400 may be interposed between the semiconductor chip 200 and the connection substrate 300. According to some embodiments, an adhesive dielectric film may be attached to a top surface of the connection substrate 300, a top surface of the semiconductor chip 200, and sidewalls of the semiconductor chip 200, forming the molding layer 400. For example, an Ajinomoto build-up film (ABF) may be used as the adhesive dielectric film. For another example, the molding layer 400 may include a dielectric polymer, such as an epoxy-based polymer. The molding layer 400 may include a different material from that of the under-fill pattern 420. Alternatively, the under-fill pattern 420 may be omitted, and the molding layer 400 may further extend into a gap between the redistribution substrate B' and the connection substrate 300.

The semiconductor package 10G may further include an upper redistribution layer 600. The upper redistribution layer 600 may be disposed on the molding layer 400 and the connection substrate 300. The upper redistribution layer 600 may include upper dielectric layers 610, upper redistribution patterns 620, and upper bonding pads 640. The upper dielectric layers 610, the upper redistribution patterns 620, and the upper bonding pads 640 may be substantially the same as those discussed above in the example of FIG. 7. However, at least one of the upper redistribution patterns 620 may further extend into the molding layer 400, thereby being coupled to the second pad 312.

Alternatively, the semiconductor package 10G may include the redistribution substrate 100C of FIG. 4. In this case, the conductive bumps 250, the connection bump 252, and the under-fill pattern 420 may be omitted from the semiconductor package 10G.

Figure 9:
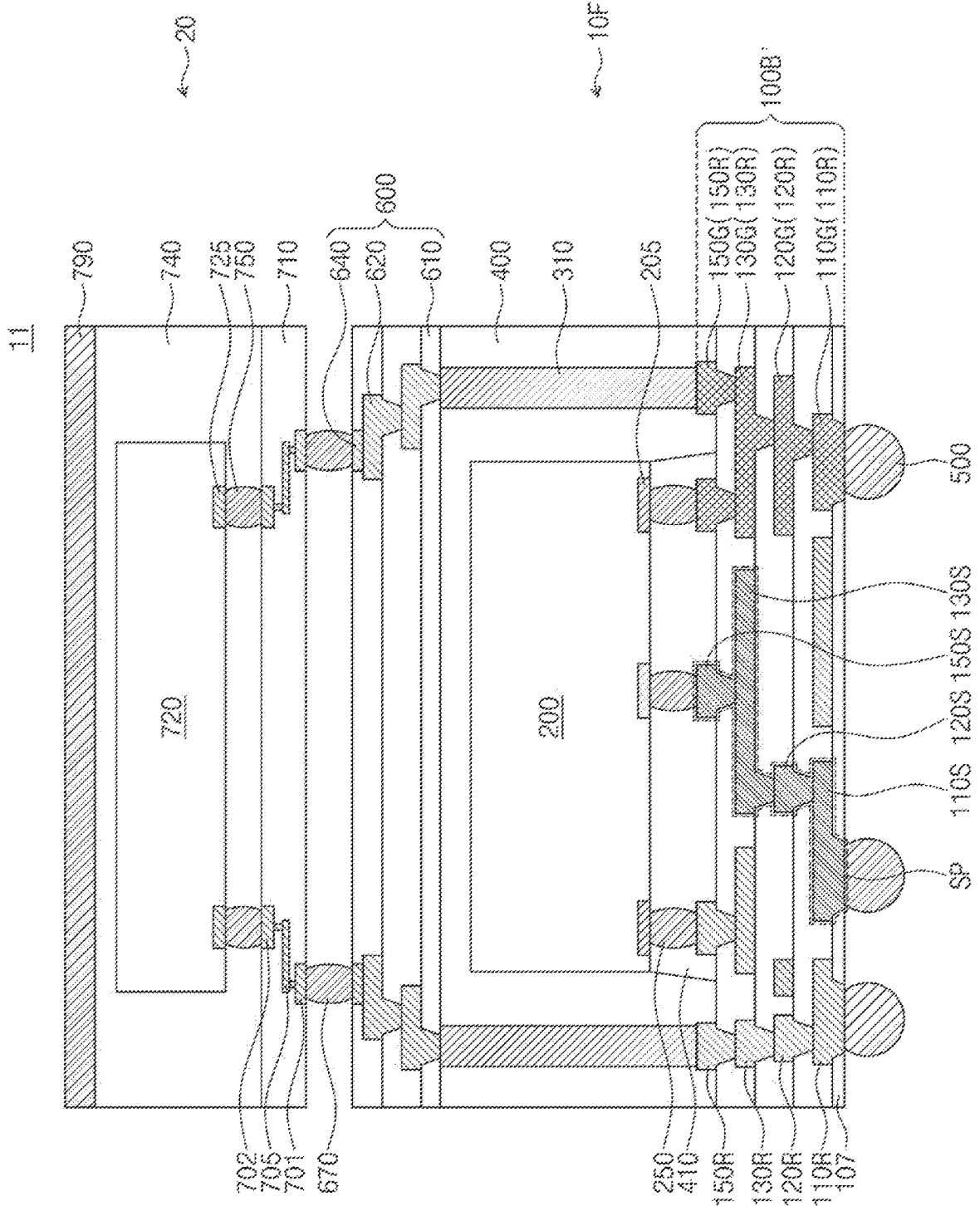
FIG. 9 illustrates a cross-sectional view showing a semiconductor package, according to example embodiments.

FIG. 9 illustrates a cross-sectional view showing a semi-conductor package according to example embodiments.

Referring to FIG. 9, a semiconductor package 11 may include a lower semiconductor package 10F' and an upper semiconductor package 20. The lower semiconductor package 10F' may be substantially the same as the semiconductor package 10F discussed in the example of FIG. 7. For example, the lower semiconductor package 10F' may include a redistribution substrate 100B', solder balls 500, a semiconductor chip 200, a conductive structure 310, a molding layer 400, and an upper redistribution layer 600. The lower semiconductor package 10F' may further include conductive bumps 250 and an under-fill layer 410. Alternatively, the lower semiconductor package 10F' may be substantially the same as the semiconductor package 10G of FIG. 8.

The upper semiconductor package 20 may be provided on the lower semiconductor package 10F'. The upper semiconductor package 20 may include an upper substrate 710, an upper semiconductor chip 720, and an upper molding layer 740. The upper substrate 710 may be disposed on and spaced apart from a top surface of the upper redistribution layer 600. The upper substrate 710 may be a printed circuit board (PCB) or a redistribution layer. The upper substrate 710 may include first substrate pads 701, second substrate pads 702, and metal lines 705. The first substrate pads 701 and the second substrate pad 702 may be respectively disposed on a bottom surface and a top surface of the upper substrate 710. The metal lines 705 may be provided in the upper substrate 710, and may be coupled to the first substrate pads 701 and the second substrate pads 702.

The upper semiconductor chip 720 may be mounted on the top surface of the upper substrate 710. The upper semiconductor chip 720 may be of a different type from the semiconductor chip 200. For example, the semiconductor chip 200 may be a logic chip, and the upper semiconductor chip 720 may be a memory chip.

The upper semiconductor chip 720 may include upper chip pads 725 and second integrated circuits (not shown). The second integrated circuits may be provided in the upper semiconductor chip 720. The upper chip pads 725 may be provided on a bottom surface of the upper semiconductor chip 720 and may be couple do the second integrated circuits. The upper chip pads 725 may include, for example, metal. The upper semiconductor package 20 may further include upper bumps 750. The upper bumps 750 may be provided between the upper substrate 710 and the upper semiconductor chip 720 and may be coupled to the second substrate pads 702 and the upper chip pads 725. The upper bumps 750 may include a solder material.

Connection solder balls 670 may be disposed between the upper redistribution layer 600 and the upper substrate 710. For example, the connection solder balls 670 may be provided between and coupled to the upper bonding pads 640 and the first substrate pads 701. Therefore, the upper semiconductor chip 720 may be electrically connected through the connection solder balls 670 to the semiconductor chip 200 or the solder balls 500.

The upper molding layer 740 may be provided on the upper substrate 710 to cover the upper semiconductor chip 720. The upper molding layer 740 may expose a top surface of the upper semiconductor chip 720, but the present inventive concepts are not limited thereto. For example, the upper molding layer 740 may cover the top surface of the upper semiconductor chip 720. The upper molding layer 740 may include a dielectric polymer, such as an epoxy-based molding compound.

The upper semiconductor package 20 may further include a thermal radiation structure 790. The thermal radiation structure 790 may be disposed on the top surface of the upper semiconductor chip 720 and on a top surface of the upper molding layer 740. The thermal radiation structure 790 may contact the top surface of the upper semiconductor chip 720 and/or the top surface of the upper molding layer 740. Although not illustrated, in some embodiments, the thermal radiation structure 790 may further extend onto a lateral surface of the upper molding layer 740. The thermal radiation structure 790 may include a heat sink, a heat slug, or a thermal interface material (TIM) layer. The thermal radiation structure 790 may include, for example, metal.

It will be understood that, although the terms "first", "second", "third", etc. may be used herein to describe various elements, these elements should not be limited by these terms. These terms are only used to distinguish one region, layer, or section from another region, layer, or section. For example, a component called "first conductive patterns" in one embodiment will be referred to as "third conductive patterns" in other embodiments or claims. In addition, a component called "third conductive patterns" in one embodiment will be referred to as "first conductive patterns" in other embodiments or claims.

According to the present inventive concepts, there may be included a signal pair pattern of a redistribution substrate. The signal pair pattern may improve in impedance characteristics and increase in electrical properties. Accordingly, a semiconductor package may enhance in electrical properties.

Terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be appreciated that "planarization," "co-planar," "planar," etc., as used herein, refer to structures (e.g., surfaces) that need not be perfectly geometrically planar, but may include acceptable variances that may result from standard manufacturing processes. The term "contact," as used herein, refers to a direct connection (i.e., touching) unless the context indicates otherwise.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:

1. A semiconductor package, comprising:
a redistribution substrate; and
a semiconductor chip on the redistribution substrate,
wherein the redistribution substrate includes:
    a plurality of first conductive patterns including a pair of first signal patterns that are adjacent to each other; and a plurality of second conductive patterns on first surfaces of the first conductive patterns and coupled to the first conductive patterns, wherein the second conductive patterns include a ground pattern insulated from the pair of first signal patterns, wherein the ground pattern has an opening that penetrates the ground pattern, and wherein, when viewed in plan view, the pair of first signal patterns overlap the opening.

2. The semiconductor package of claim 1, wherein the second conductive patterns include:

a plurality of second signal patterns coupled to the pair of first signal patterns; and a second signal redistribution pattern insulated from the second signal patterns, wherein the pair of first signal patterns do not vertically overlap the second signal redistribution pattern.

3. The semiconductor package of claim 2, wherein the redistribution substrate further includes a plurality of third conductive patterns on second surfaces of the second conductive patterns, wherein the third conductive patterns include:

a plurality of third signal patterns coupled to the second signal patterns; and a third redistribution pattern insulated from the third signal patterns, and wherein at least one of the pair of first signal patterns vertically overlaps the third redistribution pattern.

4. The semiconductor package of claim 3, wherein the third signal patterns do not overlap any of the second signal redistribution pattern and the ground pattern.

5. The semiconductor package of claim 1, wherein the first conductive patterns further include a plurality of first redistribution patterns laterally spaced apart from the pair of first signal patterns, wherein the pair of first signal patterns have a first outer lateral surface and a second outer lateral surface that are different from each other, and wherein a first horizontal interval between the first redistribution patterns and the first outer lateral surface of the pair of first signal patterns is about 90% to about 110% of a second horizontal interval between the first redistribution patterns and the second outer lateral surface of the pair of first signal patterns.

6. The semiconductor package of claim 5, wherein the pair of first signal patterns further have a third outer lateral surface different from the first and second outer lateral surfaces, and wherein a third horizontal interval between the first redistribution patterns and the third outer lateral surface of the pair of first signal patterns is about 90% to about 110% of the first horizontal interval and about 90% to about 110% of the second horizontal interval.

7. The semiconductor package of claim 5, wherein the redistribution substrate further includes a plurality of third redistribution patterns, wherein the third redistribution patterns are on second surfaces of the second conductive patterns and insulated from the pair of first signal patterns, and wherein a vertical interval between the third redistribution patterns and the pair of first signal patterns is greater than the first horizontal interval and the second horizontal interval.

8. The semiconductor package of claim 1, wherein the first conductive patterns further include a first redistribution pattern, wherein the first redistribution pattern is adjacent to and spaced apart from the first conductive patterns, wherein the opening exposes an inner sidewall of the ground pattern, and wherein the inner sidewall of the ground pattern is vertically aligned with a sidewall of the first redistribution pattern.

9. The semiconductor package of claim 1, further comprising:

a plurality of solder balls on bottom surfaces of the first conductive patterns, wherein the first surfaces of the first conductive patterns are top surfaces of the first conductive patterns.

10. The semiconductor package of claim 1, further comprising:

a plurality of conductive bumps on top surfaces of the first conductive patterns, wherein the first surfaces of the first conductive patterns are bottom surfaces of the first conductive patterns.

11. A semiconductor package, comprising:

a redistribution substrate including a plurality of first conductive patterns, a plurality of second conductive patterns, and a plurality of third conductive patterns;

a plurality of solder balls on a bottom surface of the redistribution substrate; and a semiconductor chip on a top surface of the redistribution substrate, wherein the second conductive patterns are between the first conductive patterns and the third conductive patterns, wherein the first conductive patterns include a first redistribution pattern and a first signal pattern, wherein the second conductive patterns include a second redistribution pattern insulated from the first signal pattern and a second signal pattern that vertically overlaps and contacts the first signal pattern, wherein the third conductive patterns include a third redistribution pattern that is insulated from and vertically overlaps the first signal pattern and a third signal pattern that vertically overlaps and contacts the second signal pattern, wherein the third redistribution pattern contacts a top surface of the second redistribution pattern and the second redistribution pattern contacts a top surface of the first redistribution pattern, and wherein the second redistribution pattern is not between the first signal pattern and the third conductive patterns.

12. The semiconductor package of claim 11, wherein the first signal pattern includes a pair of first signal patterns that are adjacent to each other, and wherein the pair of first signal patterns are configured to transfer a differential signal pair.

13. The semiconductor package of claim 11, wherein the second conductive patterns further include a ground pattern insulated from the first signal pattern, wherein the ground pattern has an opening that penetrates the ground pattern, and wherein the first signal pattern vertically overlaps the opening.

14. The semiconductor package of claim 13, wherein the opening exposes an inner sidewall of the ground pattern, wherein the first conductive patterns further include a plurality of first redistribution patterns, wherein the first redistribution patterns are laterally spaced apart and electrically insulated from the first signal pattern, and wherein a sidewall of one of the first redistribution patterns is vertically aligned with the inner sidewall of the ground pattern.

15. The semiconductor package of claim 11, further comprising:

a conductive structure on the redistribution substrate and laterally spaced apart from the semiconductor chip; and a molding layer on the redistribution substrate, the molding layer covering the semiconductor chip and a sidewall of the conductive structure.

16. A semiconductor package, comprising:

a redistribution substrate;

a plurality of solder balls on a bottom surface of the redistribution substrate;

a semiconductor chip on a top surface of the redistribution substrate; and a molding layer on the top surface of the redistribution substrate, the molding layer covering the semiconductor chip, wherein the redistribution substrate includes:

a dielectric layer that includes a photo-imageable polymer;

a plurality of first conductive patterns in the dielectric layer and laterally spaced apart from each other;

a plurality of second conductive patterns on surfaces of the first conductive patterns and coupled to the plurality of first conductive patterns; and a plurality of third conductive patterns on surfaces of the plurality of second conductive patterns and coupled to the plurality of second conductive patterns, wherein the plurality of first conductive patterns include:

a pair of first signal patterns that are adjacent to each other; and a plurality of first redistribution patterns laterally spaced apart from the pair of first signal pattern, wherein the plurality of first redistribution patterns are electrically insulated from the pair of first signal patterns, wherein the second conductive patterns include:

a plurality of second signal patterns coupled to the pair of first signal patterns; and a plurality of second redistribution patterns insulated from the second signal patterns, wherein the third conductive patterns include:

a plurality of third signal patterns coupled to the second signal patterns; and a plurality of third redistribution patterns insulated from the third signal patterns, wherein the pair of first signal patterns do not vertically overlap the second redistribution patterns, wherein the pair of first signal patterns vertically overlap at least one of the third redistribution patterns, wherein the first redistribution patterns include a first signal redistribution pattern, a first ground pattern, and a first power pattern, wherein the second redistribution patterns include a second signal redistribution pattern, a second ground pattern, and a second power pattern, wherein the third redistribution patterns include a third signal redistribution pattern, a third ground pattern, and a third power pattern, and wherein each of the second conductive patterns includes a via portion and a wire portion on the via portion.

17. The semiconductor package of claim 16, wherein the third signal patterns do not vertically overlap the second redistribution patterns, and wherein the third signal patterns vertically overlap at least one of the first redistribution patterns.

18. The semiconductor package of claim 16, wherein the pair of first signal patterns are configured to transfer a differential signal pair.

19. The semiconductor package of claim 16, wherein the pair of first signal patterns have a first outer lateral surface and a second outer lateral surface that are different from each other, and wherein a first horizontal interval between the first redistribution patterns and the first outer lateral surface of the pair of first signal patterns is about 90% to about 110% of a second horizontal interval between the first redistribution patterns and the second outer lateral surface of the pair of first signal patterns.

20. The semiconductor package of claim 16, further comprising a conductive structure on the redistribution substrate and laterally spaced apart from the semiconductor chip.

* * * * *